(12) United States Patent
You et al.

(10) Patent No.: US 11,467,701 B2
(45) Date of Patent: Oct. 11, 2022

(54) TOUCH SENSOR, FABRICATING METHOD THEREOF, AND DISPLAY DEVICE HAVING THE SAME

(71) Applicant: Samsung Display Co., LTD., Yongin-si (KR)

(72) Inventors: Chun Gi You, Yongin-si (KR); Ma Eum Cho, Yongin-si (KR); Hyun Sik Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/932,812

(22) Filed: Jul. 19, 2020

(65) Prior Publication Data
US 2021/0165528 A1 Jun. 3, 2021

(30) Foreign Application Priority Data

Dec. 3, 2019 (KR) ........................ 10-2019-0159197

(51) Int. Cl.
*G06F 3/044* (2006.01)
*H01L 27/32* (2006.01)

(52) U.S. Cl.
CPC .......... *G06F 3/0445* (2019.05); *G06F 3/0446* (2019.05); *G06F 2203/04103* (2013.01); *H01L 27/323* (2013.01)

(58) Field of Classification Search
CPC .................. G06F 3/0445; G06F 3/0446; G06F 2203/04103; G06F 3/041
See application file for complete search history.

(56) References Cited

U.S. PATENT DOCUMENTS

| 9,836,170 | B2  | 12/2017 | Kim et al. |  |
|---|---|---|---|---|
| 2012/0262385 | A1* | 10/2012 | Kim | G06F 3/0446 216/13 |
| 2012/0267660 | A1  | 10/2012 | Han et al. | |
| 2015/0015532 | A1* | 1/2015  | Choung | G06F 3/0445 345/174 |
| 2017/0168608 | A1* | 6/2017  | Kim | G06F 3/0446 |
| 2018/0164931 | A1  | 6/2018  | Na et al. | |
| 2018/0247807 | A1* | 8/2018  | He | G06F 3/0445 |
| 2019/0004638 | A1  | 1/2019  | Lee et al. | |
| 2019/0294278 | A1* | 9/2019  | Kim | G06F 3/0446 |
| 2020/0019280 | A1* | 1/2020  | Chen | G06F 3/0443 |

FOREIGN PATENT DOCUMENTS

| KR | 10-2016-0088994 | 7/2016 |
|---|---|---|
| KR | 10-2018-0067772 | 6/2018 |

\* cited by examiner

*Primary Examiner* — Md Saiful A Siddiqui
(74) *Attorney, Agent, or Firm* — H.C. Park & Associates, PLC

(57) ABSTRACT

A touch sensor for a display device includes: a base layer; a first conductive layer disposed in a sensing region on the base layer; an insulating layer disposed on the first conductive layer; a second conductive layer disposed on the insulating layer in the sensing region; a first insulating pattern disposed on the second conductive layer; a plurality of signal lines provided in a non-sensing region, the plurality of signal lines being electrically connected to the first and second conductive layers; and a second insulating pattern disposed on the plurality of signal lines. The first insulating pattern and the second insulating pattern include the same material and are provided in the same layer.

20 Claims, 22 Drawing Sheets

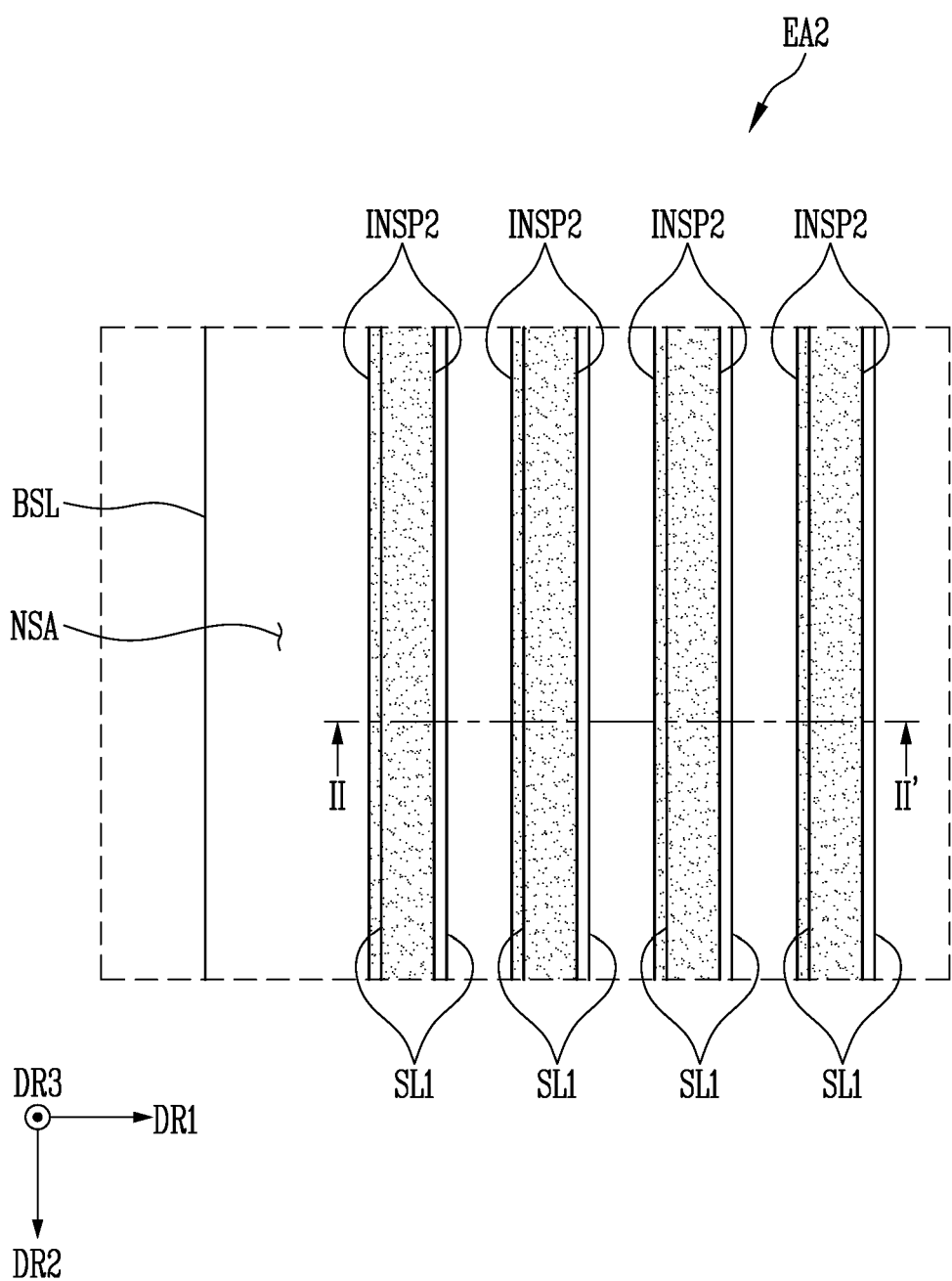

FIG. 11B
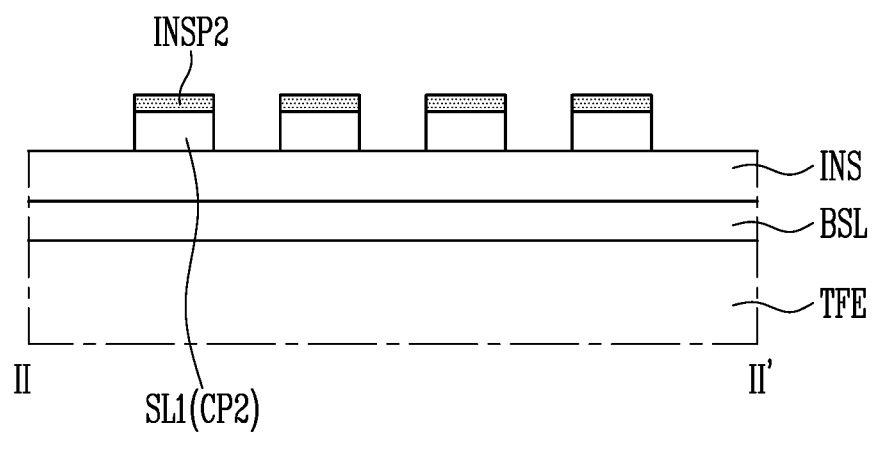
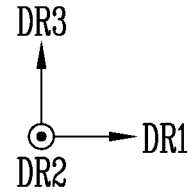

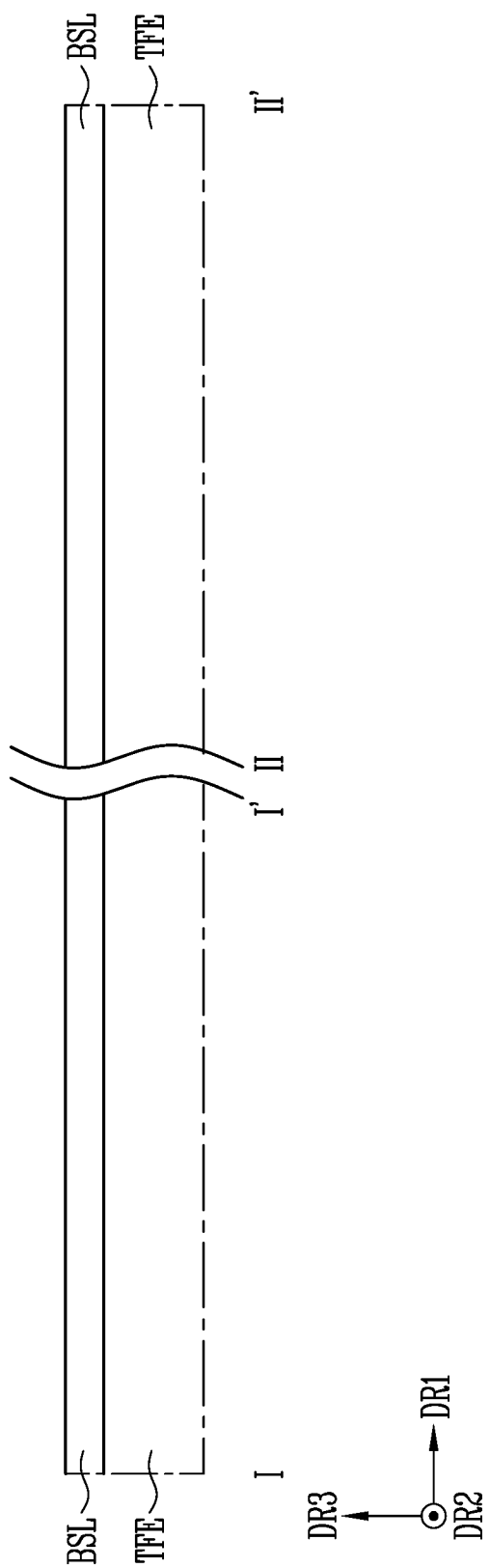

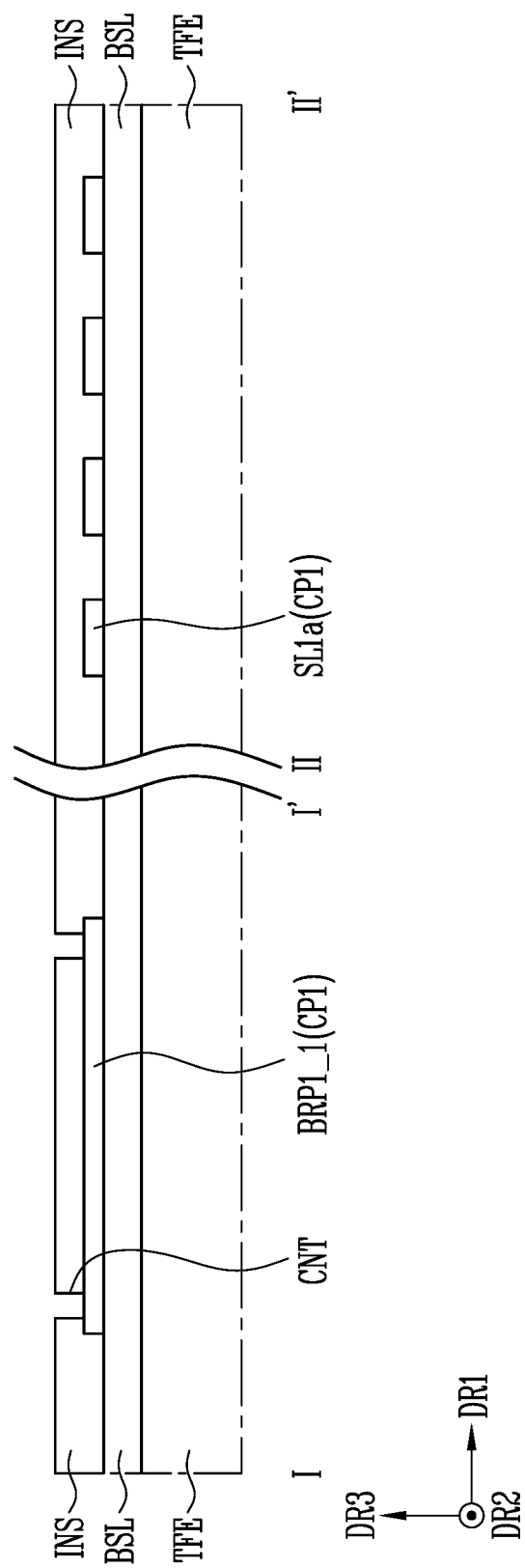

TOUCH SENSOR, FABRICATING METHOD THEREOF, AND DISPLAY DEVICE HAVING THE SAME

CROSS-REFERENCE TO RELATED APPLICATION

This application claims priority from and the benefit of Korean Patent Application No. 10-2019-0159197, filed on Dec. 3, 2019, which is hereby incorporated by reference for all purposes as if fully set forth herein.

BACKGROUND

Field

Exemplary implementations of the invention relate generally to a touch sensor, and more specifically, to a touch sensor including conductive patterns, a fabricating method thereof, and a display device having the same.

Discussion of the Background

A touch sensor is a kind of information input device, and may be provided and used in a display device. In an example, the touch sensor may be attached to one surface of a display panel or be integrally formed with the display panel. A user may input information by pressing or touching the touch sensor while viewing an image displayed on a screen.

The above information disclosed in this Background section is only for understanding of the background of the inventive concepts, and, therefore, it may contain information that does not constitute prior art.

SUMMARY

Applicant discovered during the fabricating process of touch sensors, foreign substances may be introduced that can result in a short-circuit failure during use of the touch sensor.

Touch sensors and display devices including the same constructed according to the principles and exemplary implementations of the invention and methods for fabricating the touch sensors according to the principles of the invention have improved reliability. For example, the touch sensor and method for fabricating the same may include an insulating pattern to reduce and/or minimize failures due to the fabricating process of the touch sensor. The insulating pattern may be disposed on a conductive pattern of a sensing region and a sensing line of a non-sensing region such that the insulating pattern may prevent a short-circuit failure caused by a foreign substance introduced in the fabricating process.

Additional features of the inventive concepts will be set forth in the description which follows, and in part will be apparent from the description, or may be learned by practice of is the inventive concepts.

According to one aspect of the invention, a touch sensor for a display device includes: a base layer; a first conductive layer disposed in a sensing region on the base layer; an insulating layer disposed on the first conductive layer; a second conductive layer disposed on the insulating layer in the sensing region; a first insulating pattern disposed on the second conductive layer; a plurality of signal lines provided in a non-sensing region, the plurality of signal lines being electrically connected to the first and second conductive layers; and a second insulating pattern disposed on the plurality of signal lines. The first insulating pattern and the second insulating pattern include the same material and are provided in the same layer.

The first insulating pattern may overlap the second conductive layer, and the second insulating pattern may overlap the signal lines.

The first insulating pattern and the second conductive layer may have substantially the same shape in plan, and the second insulating pattern and the signal lines may have substantially the same shape in plan.

The first insulating pattern may be in contact with at least a portion of the second conductive layer.

The first insulating pattern and the second insulating pattern may include at least one of an inorganic insulating material and an organic insulating material.

The second conductive layer may include a second conductive pattern including: a plurality of first sensor patterns disposed on the insulating layer, the plurality of first sensor patterns being arranged in a first direction; a plurality of second sensor patterns disposed on the insulating layer, the plurality of second sensor patterns being arranged in a second direction intersecting the first direction, the plurality of second sensor patterns being spaced apart from the first sensor patterns; and a plurality of second bridge patterns connecting the second sensor patterns to each other. The first conductive layer may include a first conductive pattern including a plurality of first bridge patterns disposed between the base layer and the insulating layer in the sensing region, the plurality of first bridge patterns connecting the first sensor patterns to each other.

The first insulating pattern may be disposed on each of the first sensor patterns, the second sensor patterns, and the second bridge patterns.

The first insulating pattern may be formed in the same process as each of the first sensor patterns, the second sensor patterns, and the second bridge patterns.

The first insulating pattern may be in contact with at least a portion of each of the first sensor patterns, at least a portion of each of the second sensor patterns, and at least a portion of each of the second bridge patterns.

The first insulating pattern may be in contact with an upper surface of the first sensor pattern, an upper surface of the second sensor pattern, and an upper surface of the second bridge pattern.

The second insulating pattern may be in contact with at least a portion of each of the signal lines.

The signal lines may include sensing lines and at least some of the sensing lines may include: a first metal layer disposed between the base layer and the insulating layer; and a second metal layer disposed between the insulating layer and the second insulating pattern, the second metal layer overlapping the first metal layer. The second insulating pattern and the second metal layer may be provided through the same process.

According to another aspect of the invention, a method of fabricating a touch sensor for a display device includes the steps of: providing a base layer for a sensing region and a non-sensing region surrounding at least one side of the sensing region; forming, on the base layer, a first conductive layer in the sensing region and at least one first metal layer in the non-sensing region; forming an insulating layer on the first conductive layer and the first metal layer, the insulating layer including contact holes exposing at least a portion of the first conductive layer; sequentially forming a metal material layer and an insulating material layer on the insulating layer; and forming a second conductive layer having a first insulating pattern disposed on the top thereof and a second metal layer having a second insulating pattern disposed on the top thereof by simultaneously etching the metal material layer and the insulating material layer. The second conductive layer and the first insulating pattern correspond to the sensing region on the insulating layer, and the second metal layer and the second insulating pattern correspond to the non-sensing region on the insulating layer. The first insulating pattern and the second insulating pattern include at least one of an inorganic insulating material and an organic insulating material.

The second conductive layer may include: a plurality of first sensor patterns disposed on the insulating layer, the plurality of first sensor patterns being arranged in a first direction; a plurality of second sensor patterns disposed on the insulating layer, the plurality of second sensor patterns being arranged in a second direction intersecting the first direction, the plurality of second sensor patterns being spaced apart from the first sensor patterns; and a plurality of second bridge patterns connecting the second sensor patterns to each other. The first conductive layer may include a plurality of first bridge patterns disposed between the base layer and the insulating layer in the sensing region, the plurality of first bridge patterns connecting the first sensor patterns to each other.

The first insulating pattern may be disposed on each of the first sensor patterns, the second sensor patterns, and the second bridge patterns.

The first insulating pattern may be in contact with an upper surface of the first sensor pattern, an upper surface of the second sensor pattern, and an upper surface of the second bridge pattern.

According to still another aspect of the invention, a display device includes: a display panel to display an image; and a touch sensor disposed on the display panel. The touch sensor includes: a base layer disposed on the display panel; a first conductive layer disposed in a sensing region on the base layer; an insulating layer disposed on the first conductive layer; a second conductive layer disposed on the insulating layer in the sensing region; a first insulating pattern disposed on the second conductive layer; a plurality of signal lines provided in a non-sensing region on the base layer, the plurality of signal lines being electrically connected to the first and second conductive layers; and a second insulating pattern disposed on the plurality of signal lines. The first insulating pattern and the second insulating pattern include the same material and are provided in the same layer.

The first insulating pattern and the second insulating pattern may include at least one of an inorganic insulating material and an organic insulating material.

The first insulating pattern may overlap the second conductive layer, and the second insulating pattern may overlap the signal lines. The first insulating pattern and the second conductive layer may have substantially the same shape in plan, and the second insulating pattern and the signal lines may have substantially the same shape in plan.

The second conductive layer may include a second conductive pattern including: a plurality of first sensor patterns disposed on the insulating layer, the plurality of first sensor patterns being arranged in a first direction; a plurality of second sensor patterns disposed on the insulating layer, the plurality of second sensor patterns being arranged in a second direction intersecting the first direction, the plurality of second sensor patterns being spaced apart from the first sensor patterns; and a plurality of second bridge patterns connecting the second sensor patterns to each other. The first conductive layer may include a second conductive pattern including a plurality of first bridge patterns disposed between the base layer and the insulating layer in the sensing region, the plurality of first bridge patterns connecting the first sensor patterns to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10 is an enlarged plan view schematically illustrating portion EA2 of FIG. 6.

FIGS. 11A and 11B are cross-sectional views taken along line II-II' of FIG. 10 illustrating exemplary embodiments of the touch sensor.

FIGS. 12A to 12E are schematic cross-sectional views sequentially illustrating an exemplary embodiment of a touch sensor at some of the processes of fabricating the touch sensor according to the principles of the invention.

DETAILED DESCRIPTION

Figure 1:
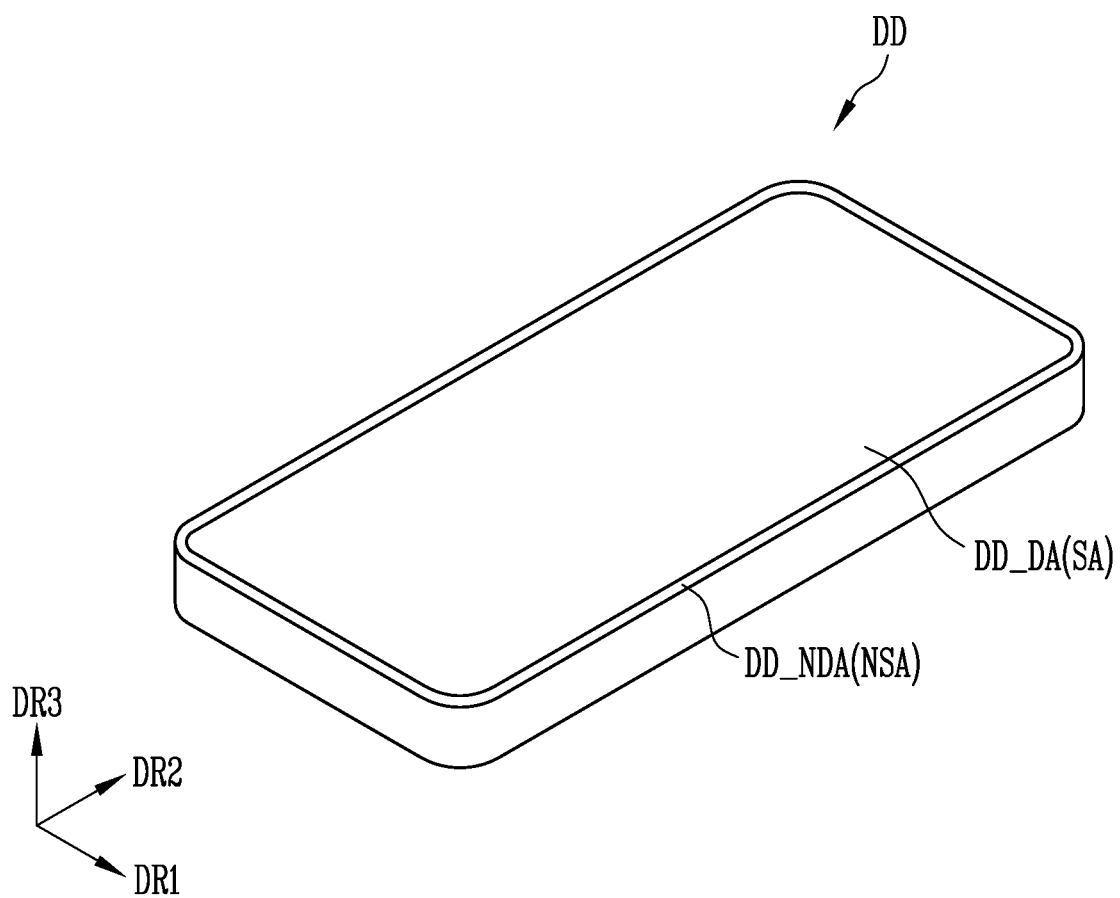
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," s and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
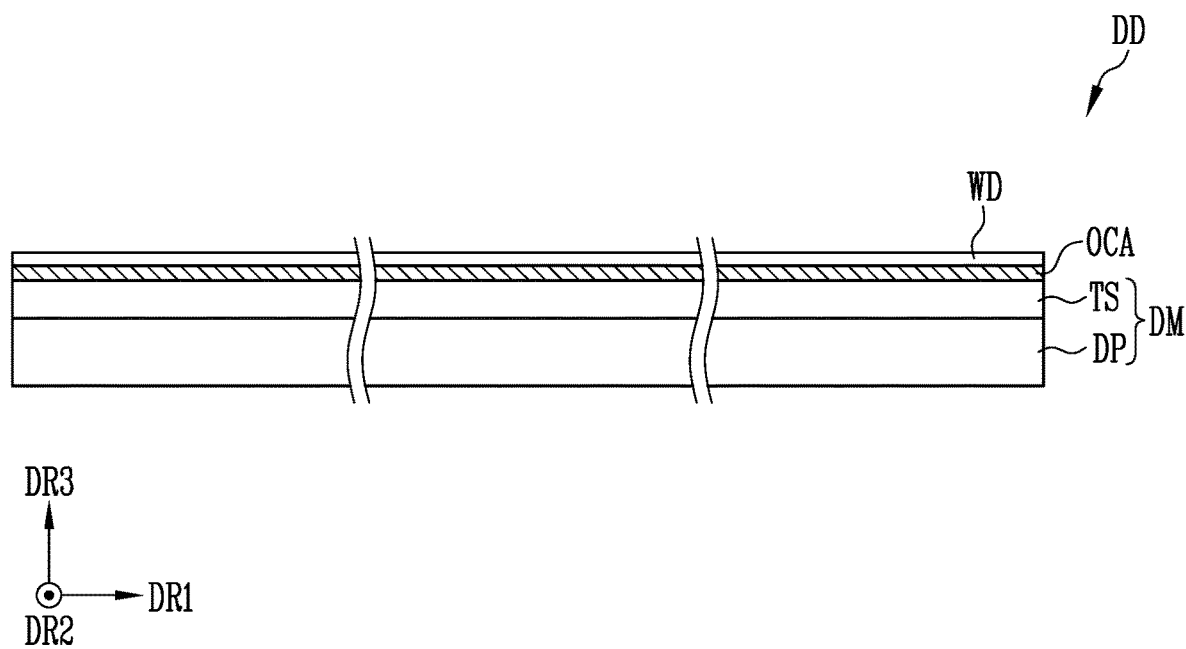
FIG. 2 is a schematic cross-sectional view of the display device of FIG. 1.

FIG. 1 is a perspective view of an exemplary embodiment of a display device constructed according to the principles of the invention. FIG. 2 is a schematic cross-sectional view of the display device of FIG. 1.

Referring to FIGS. 1 and 2, a display device DD may include a display module DM and a window WD.

The display device DD may be provided in various shapes. In an example, the display device DD may be provided in a generally rectangular plate shape having two pairs of generally parallel sides, but exemplary embodiments are not limited thereto. When the display device DD is provided in the rectangular plate shape, any one pair of sides among the two pairs of sides may be provided longer than the other pair of sides. In an embodiment, a case where the display device DD is provided in a rectangular shape having a pair of long sides and a pair of short sides is illustrated for convenience of description. The longitudinally extending direction of the long sides is represented as a second direction DR2, the longitudinally extending direction of the short sides is represented as a first direction DR1, and the direction perpendicular to the first and second directions DR1 and DR2 is represented as a third direction DR3. As described above, in the display device DD provided in the generally rectangular plate shape, a corner portion at which one long side and one short side are in contact with each other may have a round shape.

In an embodiment, at least a portion of the display device DD may have flexibility, and the display device DD may be folded at a portion having flexibility.

The display device DD may include a display region DD_DA for displaying an image and a non-display region DD_NDA provided at at least one side of the display region DD_DA. The non-display region DD_NAD is a region in which the image is not displayed.

In some embodiments, the display device DD may include a sensing region SA and a non-sensing region NSA vertically overlapping the display region DD_DA and the non-display region DD_NDA, respectively. The display device DD may not only display an image through the sensing region SA but also sense a touch input and/or light incident from the front thereof. The non-sensing region NSA may surround the sensing region SA. However, this is merely illustrative, and exemplary embodiments are not limited thereto. Although a case where the sensing region SA has a shape including round-shaped corners and corresponds to the display region DD_DA is illustrated in FIG. 1, exemplary embodiments are not limited thereto. In some embodiments, a partial region of the display region DD_DA may correspond to the sensing region SA.

The shape, size, and arrangement position of the sensing region SA of the display device DD may be variously modified according to sensor patterns which will be described later.

The display module DM may include a display panel DP and a touch sensor TS.

The display panel DP may display an image. Self-luminescent display panels such as an organic light emitting display panel (OLED panel) may be used as the display panel DP. Also, non-luminescent display panels such as a liquid crystal display panel (LCD panel), an electrophoretic display panel (EPD panel), and an electro-wetting display panel (EWD panel) may be used as the display panel DP. When a non-luminescent display panel is used as the display panel DP, the display device DD may have a backlight unit for supplying light to the display panel DP.

The touch sensor TS may be disposed on a surface from which an image of the display panel DP is emitted, to receive a touch input of a user. The touch sensor TS may recognize a touch event of the display device DD caused by a hand of a user or a separate input means. The touch sensor TS may recognize a touch event by using a capacitive method.

The window WD for protecting an exposed surface of the display module DM may be provided on the display module DM. The window WD may protect the display module DM from external impact, and provide an input surface and/or a display surface to a user. The window WD may be coupled to the display module DM by using an Optically Clear Adhesive (or gluing) (OCA) member.

The window WD may have a multi-layered structure selected from a glass substrate, a plastic film, and a plastic substrate. The multi-layered structure may be formed through a continuous process or an attachment process using an adhesive layer. The whole or a portion of the window WD may have flexibility.

Figure 3:
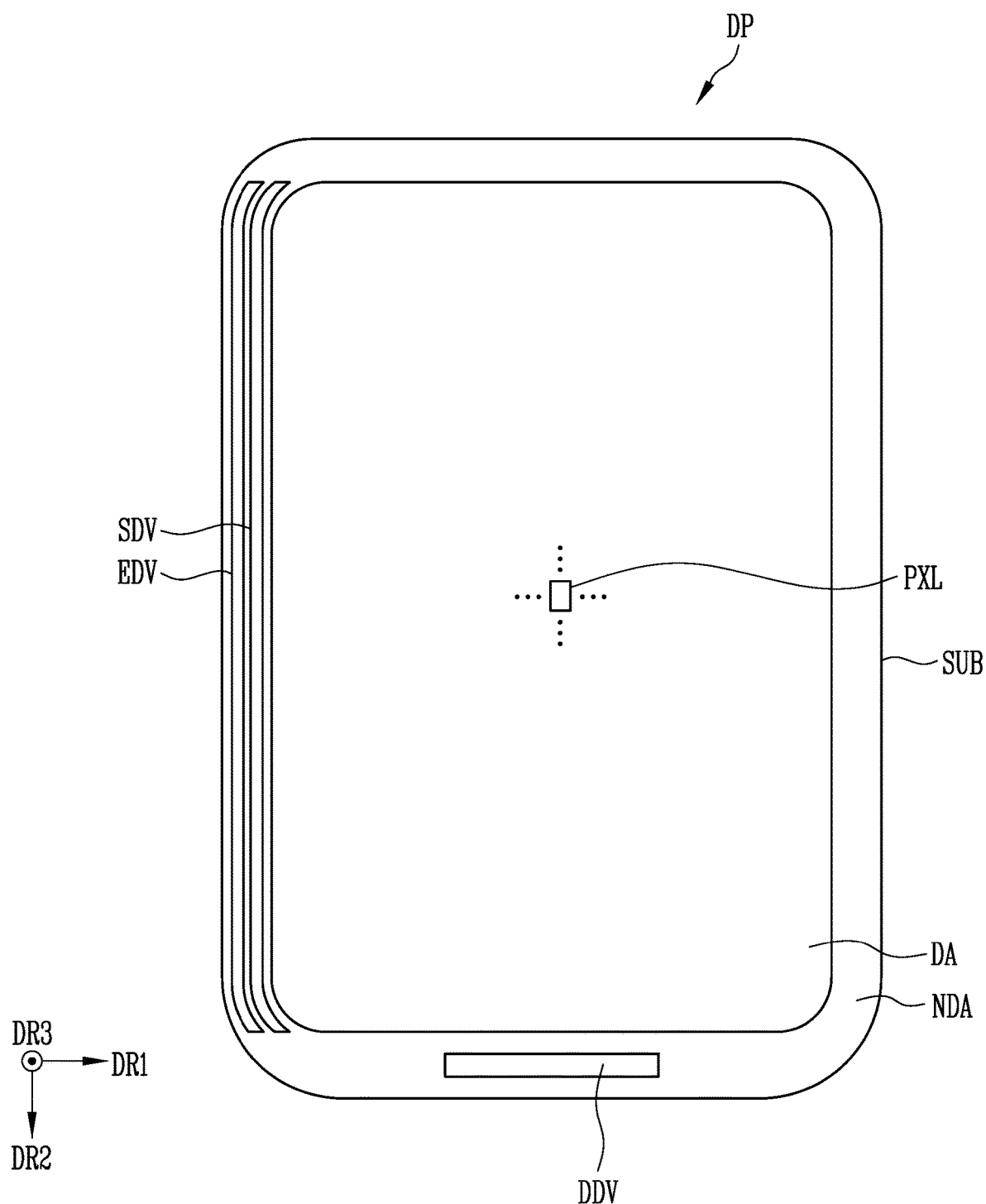
FIG. 3 is a plan view of an exemplary embodiment of the display panel of FIG. 2.

FIG. 3 is a plan view of an exemplary embodiment of the display panel of FIG. 2.

Referring to FIGS. 1 to 3, a display panel DP may include a substrate SUB, pixels PXL provided on the substrate SUB, a drive unit provided on the substrate SUB to drive the pixels PXL, and a line unit connecting the pixels PXL to the drive unit.

The substrate SUB may be provided as one region having an approximately rectangular shape. However, a number of regions provided in the substrate SUB may be different therefrom, and the shape of the substrate SUB may be changed depending on a region provided in the substrate SUB.

The substrate SUB may be made of an insulative material such as glass or resin. Also, the substrate SUB may be made of a material having flexibility to be bendable or foldable, and have a single- or multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like.

However, the material constituting the substrate SUB may be variously changed, and the substrate SUB may be made of a fiber reinforced plastic (FRP), etc.

The substrate SUB may include a display region DA and a non-display region NDA. The display region DA may be a region provided with the pixels PXL to display an image, and the non-display region NDA is a region in which the pixels PXL are not provided. The non-display region NDA may be a region in which the image is not displayed. For convenience of description, a representative pixel PXL is illustrated in FIG. 3, but a plurality of is pixels PXL may be substantially arranged in the display region DA of the substrate SUB.

The display region DA of the display panel DP may correspond to the display region DD_DA of the display device DD, and the non-display region NDA of the display panel DP may correspond to the non-display region DD_NDA of the display device DD.

The non-display region NDA may be provided with the drive unit for driving the pixels PXL and some of lines connecting the pixels PXL to the drive unit. The non-display region NDA may correspond to a bezel region of the display device DD.

The pixels PXL may be provided in the display region DA of the substrate SUB. Each of the pixels PXL may be a minimum unit to display an image. Each of the pixels PXL may include an organic light emitting device emitting white light and/or colored light. Each of the pixels PXL may emit any one color among red, green, and blue. However, exemplary embodiments are not limited thereto, and the pixel PXL may emit light of any color such as cyan, magenta or yellow.

The pixels PXL may be arranged in a matrix form along rows extending in a first direction DR1 and columns extending in a second direction DR2 intersecting the first direction DR1. However, the arrangement form of the pixels PXL is not particularly limited, and the pixels PXL may be arranged in various forms.

The drive unit provides signals to each of the pixels PXL through the line unit, and controls driving of the pixels PXL. For convenience of description, the line unit is omitted in FIG. 3. The line unit will be described later with reference to FIG. 4A.

The drive unit may include a scan driver SDV for transferring a scan signal to each of the pixels PXL along a scan line, an emission driver EDV for providing an emission control signal to each of the pixels PXL along an emission control line, a data driver DDV for providing a data signal to each of the pixels PXL along a data line, and a timing controller. The timing controller controls the scan driver SDV, the emission driver EDV, and the data driver DDV.

Figure 4A:
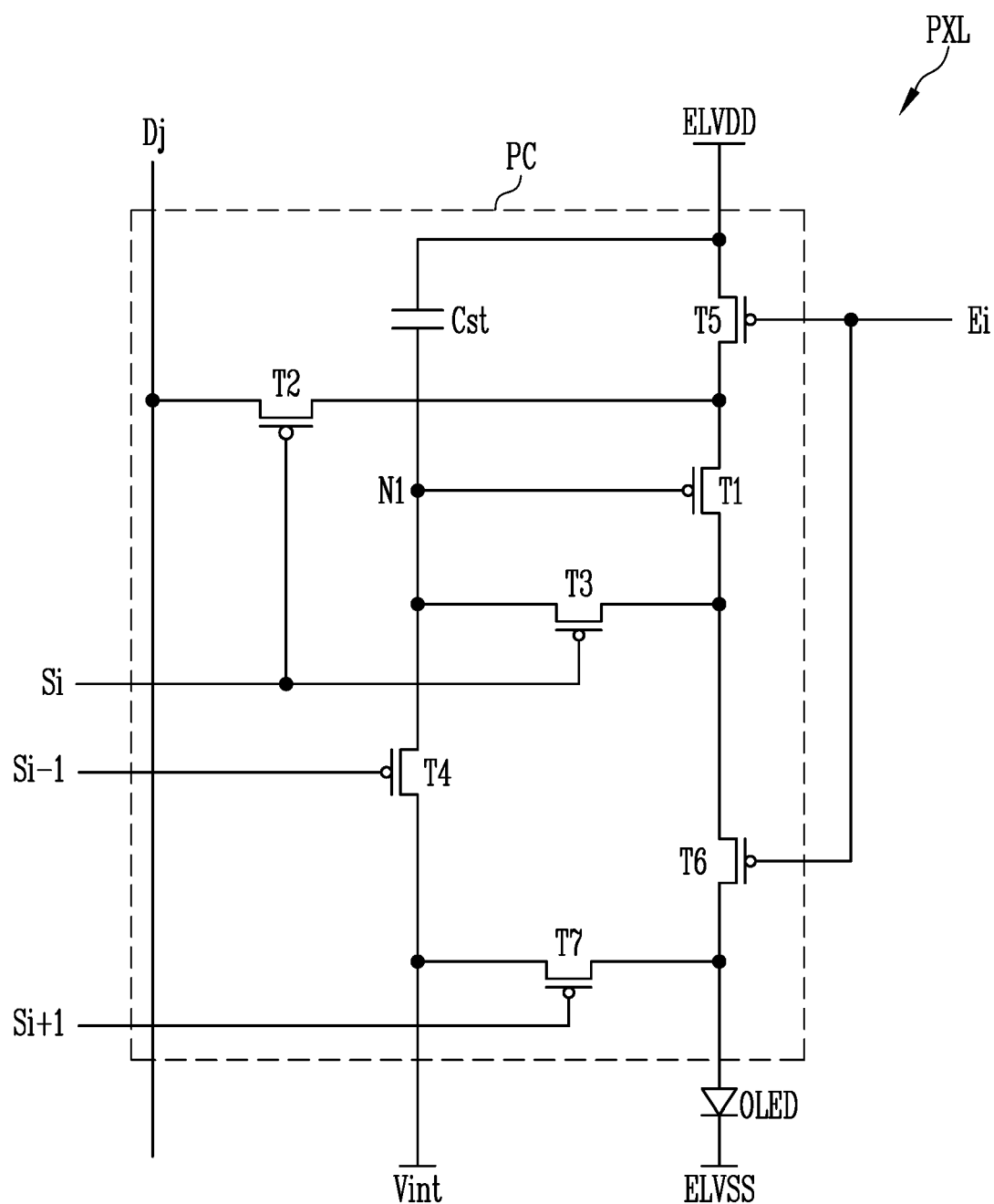
FIG. 4A is an equivalent circuit diagram of a representative pixel of FIG. 3.

FIG. 4A is an equivalent circuit diagram of a representative pixel of FIG. 3.

Referring to FIGS. 1 to 4A, each of the pixels PXL may include a light emitting element OLED and a pixel circuit PC for driving the light emitting element OLED. In an embodiment, the light emitting element OLED may mean an organic light emitting diode.

The pixel circuit PC may be connected to a scan line Si and a data line Dj of a corresponding pixel PXL. In an example, when a pixel PXL is disposed on an ith (i is a natural number) row and a jth (j is a natural number) column of the display region DA of the display panel DP, the pixel circuit PC of the pixel PXL may be connected to an ith scan line Si and a jth data line Dj of the display region DA. In some embodiments, the pixel circuit PC may be further connected to at least another scan line. For example, one pixel PXL disposed on the ith row of s the display region DA may be further connected to an (i−1)th scan line Si−1 and/or an (i+1)th scan line Si+1. In some embodiments, the pixel circuit PC may be further connected to a third power source in addition to first and second pixel power sources ELVDD and ELVSS. For example, the pixel circuit PC may also be connected to an initialization power source Vint.

The pixel circuit PC may include first to seventh transistors T1 to T7 and a storage capacitor Cst.

One electrode, e.g., a source electrode of the first transistor T1 (driving transistor) may be connected to a power line to which a first pixel power source ELVDD is applied via the fifth transistor T5, and another electrode, e.g., a drain electrode of the first transistor T1 may be connected to the light emitting element OLED via the sixth transistor T6. In addition, a gate is electrode of the first transistor T1 may be connected to a first node N1. The first transistor T1 controls a driving current flowing between the first pixel power source ELVDD and a second pixel power source ELVSS via the light emitting element OLED, corresponding to a voltage of the first node N1.

The second transistor T2 (switching transistor) may be connected between the jth data line Dj connected to the pixel PXL and the source electrode of the first transistor T1. In addition, a gate electrode of the second transistor T2 may be connected to the ith scan line Si connected to the pixel PXL. The second transistor T2 may be turned on when a scan signal having a gate-on voltage (e.g., a low voltage) is supplied from the ith scan line Si, to electrically connect the jth data line Dj to the source electrode of the first transistor T1. Therefore, when the second transistor T2 is turned on, a data signal supplied from the jth data line Dj is transferred to the first transistor T1.

The third transistor T3 may be connected between the drain electrode of the first transistor T1 and the first node N1. In addition, a gate electrode of the third transistor T3 may be connected to the ith scan line Si. The third transistor T3 may be turned on when a scan signal having a gate-on voltage is supplied from the ith scan line Si, to electrically connect the drain electrode of the first transistor T1 and the first node N1.

The fourth transistor T4 may be connected between the first node N1 and an initialization power line to which the initialization power source Vint is applied. In addition, a gate electrode of the fourth transistor T4 may be connected to a previous scan line, e.g., the (i−1)th scan line Si−1. The fourth transistor T4 may be turned on when a scan signal having a gate-on voltage is supplied from the (i−1)th scan line Si−1, to transfer a voltage of the initialization power source Vint to the first node N1. The initialization power source Vint may have a voltage is equal to or smaller than the lowest voltage of the data signal.

The fifth transistor T5 may be connected between the first pixel power source ELVDD and the first transistor T1. In addition, a gate electrode of the fifth transistor T5 may be connected to a corresponding emission control line, e.g., an ith emission control line Ei. The fifth transistor T5 may be turned off when an emission control signal having a gate-off voltage is supplied from the ith emission control line Ei, and be turned on in other cases.

The sixth transistor T6 may be connected between the first transistor T1 and the light emitting element OLED. In addition, a gate electrode of the sixth transistor T6 may be connected to the ith emission control line Ei. The sixth transistor T6 may be turned off when an emission control signal having a gate-off voltage is supplied from the ith emission control line Ei, and be turned on in other cases.

The seventh transistor T7 may be connected between the light emitting element OLED and the initialization power line to which the initialization power source Vint is applied. In addition, a gate electrode of the seventh transistor T7 may be connected to any one of scan lines of a next stage, e.g., the (i+1)th scan line Si+1. The seventh transistor T7 may be turned on when a scan signal having a gate-on voltage is supplied from the (i+1)th scan line Si+1, to supply the voltage of the initialization power source Vint to the light emitting element OLED.

The storage capacitor Cst may be connected between the first pixel power source ELVDD and the first node N1. The storage capacitor Cst may store a data signal supplied to the first node in each frame period and a threshold voltage of the first transistor T1.

An anode electrode of the light emitting element OLED may be connected to the first transistor T1 via the sixth transistor T6, and a cathode electrode of the light emitting element OLED may be connected to the second pixel power source ELVSS. The light emitting element OLED may generate light with a luminance corresponding to an amount of current supplied through the first transistor T1. The first pixel power source ELVDD may be set to have a voltage higher than that of the second pixel power source ELVSS such that current can flow through the light emitting element OLED. The potential difference between the first pixel power source ELVDD and the second pixel power source ELVSS may be set to a threshold voltage or more of the light emitting element OLED during an emission period.

Figure 4B:
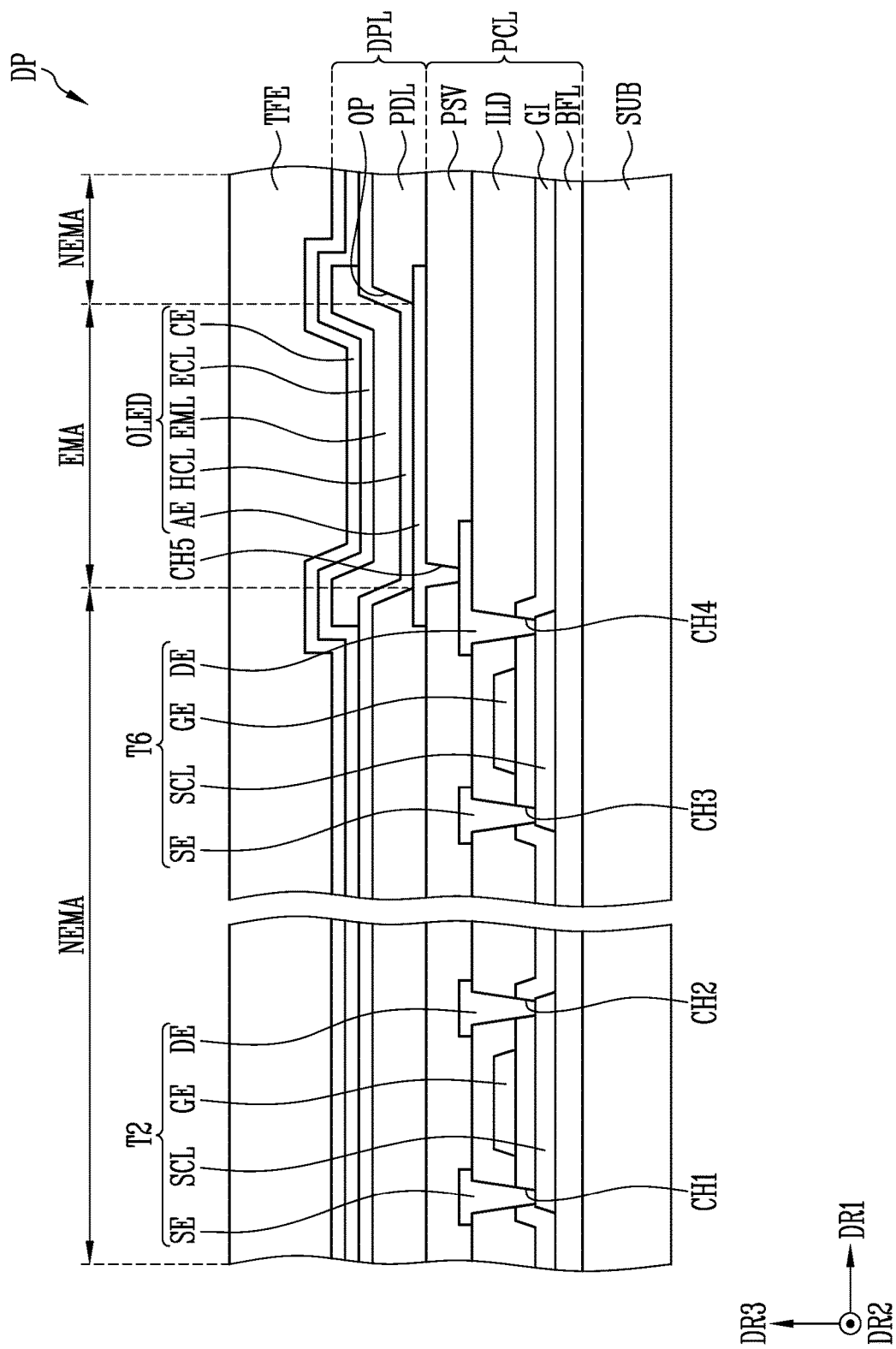
FIG. 4B is a cross-sectional view of a portion of the display panel of FIG. 3.

FIG. 4B is a cross-sectional view of a portion of the display panel of FIG. 3.

In FIG. 4B, only a section of a portion corresponding to each of the second and sixth transistors among the first to seventh transistors shown in FIG. 4A is illustrated for convenience of description.

Referring to FIGS. 1 to 4B, the display panel DP may include a substrate SUB, a pixel circuit layer PCL, a display element layer DPL, and a thin film encapsulation layer TFE.

The substrate SUB may include an insulative material such as glass, organic polymer or quartz. Also, the substrate SUB may be made of a material having flexibility to be bendable or foldable, and have a single- or multi-layered structure. The substrate SUB may have the same configuration as the substrate SUB described with reference to FIG. 3.

The pixel circuit layer PCL may include a buffer layer BFL, the second and sixth transistors T2 and T6, and a passivation layer PSV.

The buffer layer BFL may be provided on the substrate SUB, and prevent an impurity from being diffused into the second and sixth transistors T2 and T6. The buffer layer BFL may be provided in a single layer, or in a multi-layer including at least two layers. The buffer layer BFL may be omitted according to the material and process conditions of the substrate SUB.

Each of the second and sixth transistors T2 and T6 may include a semiconductor layer SCL, a gate electrode GE, a source electrode SE, and a drain electrode DE.

The semiconductor layer SCL of each of the second and sixth transistors T2 and T6 may be provided on the buffer layer BFL. The semiconductor layer SCL may include source and drain regions respectively in contact with the source electrode SE and the drain electrode DE. A region between the source region and the drain region may be a channel region.

The semiconductor layer SCL may be a semiconductor pattern made of poly-silicon, amorphous silicon, oxide semiconductor, etc. The channel region is an intrinsic semiconductor pattern undoped with an impurity. The impurity may include impurities such as an n-type impurity, a p-type impurity, and other metals. Each of the source and drain regions may be a semiconductor pattern doped with the impurity.

The gate electrode GE of each of the second and sixth transistors T2 and T6 may be provided on a corresponding semiconductor layer SCL with a gate insulating layer GI interposed therebetween.

The source electrode SE of each of the second and sixth transistors T2 and T6 may be in contact with the source region of a corresponding semiconductor layer SCL through a contact hole penetrating an interlayer insulating layer ILD and the gate insulating layer GI. In an example, the source electrode SE of the second transistor T2 may be in contact with the source region of a corresponding semiconductor layer SCL through a first contact hole CH1 penetrating the interlayer insulating layer ILD and the gate insulating layer GI, and the source electrode SE of the sixth transistor T6 may be in contact with the source region of a corresponding semiconductor layer SCL through a third contact hole CH3 penetrating the interlayer insulating layer ILD and the gate insulating layer GI.

The drain electrode DE of each of the second and sixth transistors T2 and T6 may be in contact with the drain region of a corresponding semiconductor layer SCL through a contact hole penetrating the interlayer insulating layer ILD and the gate insulating layer GI. In an example, the drain electrode DE of the second transistor T2 may be in contact with the drain region of a corresponding semiconductor layer SCL through a second contact hole CH2 penetrating the interlayer insulating layer ILD and the gate insulating layer GI, and the drain electrode DE of the sixth transistor T6 may be in contact with the drain region of a corresponding semiconductor layer SCL through a fourth contact hole CH4 penetrating the interlayer insulating layer ILD and the gate insulating layer GI.

In an embodiment, each of the interlayer insulating layer ILD and the gate insulating layer GI may be configured with an inorganic insulating layer including an inorganic material or an organic insulating layer including an organic material.

The passivation layer PSV may be provided over the second and sixth transistors T2 and T6 to cover the second and sixth transistors T2 and T6. The passivation layer PSV may include a fifth contact hole CH5 through which a portion of the drain electrode DE of the sixth transistor T6 is exposed to the outside.

The display element layer DPL may include a light emitting element OLED provided on the passivation layer PSV, the light emitting element OLED emitting light.

The light emitting element OLED may include first and second electrodes AE and CE and an emitting layer EML provided between the two electrodes AE and CE. Any one of the first and second electrodes AE and CE may be an anode electrode, and the other of the first and second electrodes AE and CE may be a cathode electrode. For example, the first electrode AE may be the anode electrode, and the second electrode CE may be the cathode electrode. When the light emitting element OLED is a top-emission organic light emitting device, the first electrode AE may be a reflective electrode, and the second electrode CE may be a transmissive electrode. In an embodiment, a case where the light emitting element OLED is the top-emission organic light emitting device, and the first electrode AE is the anode electrode is described as an example.

The first electrode AE may be electrically connected to the drain electrode DE of the sixth transistor T6 through the fifth contact hole CH5 penetrating the passivation layer PSV. The first electrode AE may include a reflective layer capable of reflecting light and a transparent conductive layer disposed on the top or bottom of the reflective layer. At least one of the transparent conductive layer and the reflective layer may be electrically connected to the drain electrode DE of the sixth transistor T6.

The display element layer DPL may further include a pixel defining layer PDL having an opening OP through which a portion of the first electrode AE, e.g., an upper surface of the first electrode AE is exposed.

Each pixel PXL provided in the display panel DP may be disposed in a pixel region included in the display region DA. In an embodiment, the pixel region may include an emission region EMA and a non-emission region NEMA adjacent to the emission region EMA. The non-emission region NEMA may surround the emission region EMA. In this embodiment, the emission region EMA may be defined corresponding to a partial region of the first electrode AE, which is exposed by the opening OP.

The display element layer DPL may include a hole control layer HCL and an electron control layer ECL.

The hole control layer HCL may be commonly disposed in the emission region EMA and the non-emission region NEMA. A common layer such as the hole control layer HCL may be formed in a plurality of pixels PXL.

The emitting layer EML is disposed on the hole control layer HCL. The emitting layer EML may be disposed in a region corresponding to the opening OP. That is, the emitting layer EML may be separated to be respectively provided in a plurality of pixels PXL. The emitting layer EML may include an organic material and/or an inorganic material. In an embodiment, a patterned emitting layer EML is exemplarily illustrated. However, in some embodiments, the emitting layer EML may be commonly provided in the pixels PXL. The color of light generated in the emitting layer EML may be one of red, green, blue, and white, but this embodiment is not limited thereto. For example, the color of light generated in the emitting layer EML may be one of magenta, cyan, and yellow.

The electron control layer ECL may be provided on the emitting layer EML. The electron control layer ECL may be commonly formed in the pixels PXL, and function to inject and/or transport electrons into the emitting layer EML.

The second electrode CE may be provided on the electron control layer ECL. The second electrode CE may be commonly provided in the pixels PXL.

The thin film encapsulation layer TFE covering the second electrode CE may be provided over the second electrode CE.

The thin film encapsulation layer TFE may be provided in a single layer or in a multi-layer. The thin film encapsulation layer TFE may include a plurality of insulating layers covering the light emitting element OLED. Specifically, the thin film encapsulation layer TFE may include at least one inorganic layer and at least one organic layer. For example, the thin film encapsulation layer TFE may have a structure in which the inorganic and organic layers are alternately stacked. In some embodiments, the thin film encapsulation layer TFE may be an encapsulation substrate which is disposed over the light emitting element OLED and is joined with the substrate through a sealant.

Figure 5:
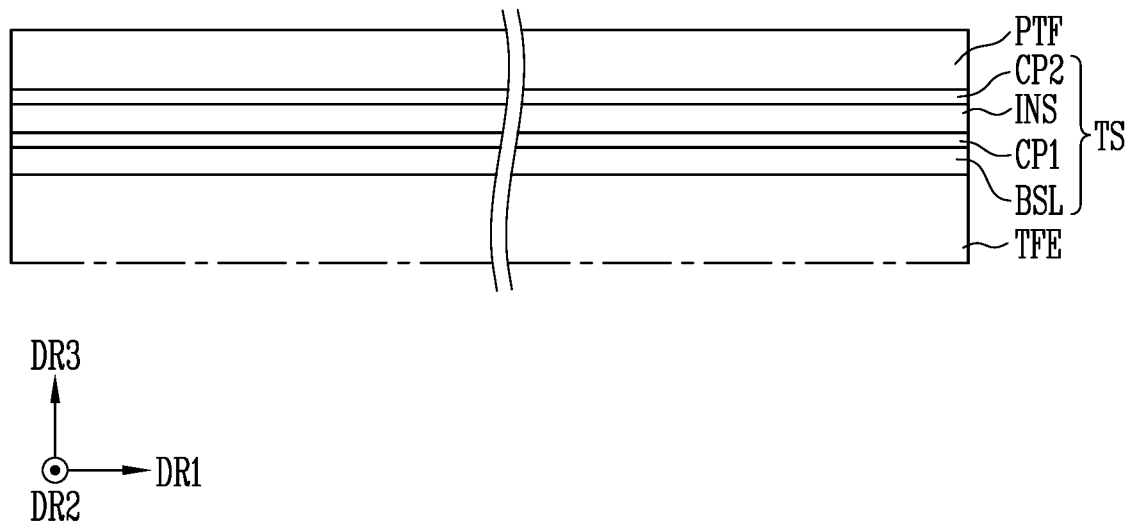
FIG. 5 is a schematic cross-sectional view of an exemplary embodiment of the touch sensor of FIG. 2.

FIG. 5 is a schematic cross-sectional view of an exemplary embodiment of the touch sensor of FIG. 2.

Referring to FIGS. 1 to 5, the touch sensor TS may include a base layer BSL, a first conductive layer which may be in the form of a conductive pattern CP1, a touch insulating layer INS, and a second conductive layer, which may be in the form of a conductive pattern CP2. A protective film PTF may be provided and/or formed on the touch sensor TS.

The first conductive pattern CP1 may be directly disposed on the thin film encapsulation layer TFE of the display panel DP, but exemplary embodiments are not limited thereto. In some embodiments, another insulating layer, e.g., the base layer BSL may be disposed between the first conductive pattern CP1 and the thin film encapsulation layer TFE. The first conductive pattern CP1 may be directly disposed on the base layer BSL.

Each of the first and second conductive patterns CP1 and CP2 may have a single-layered structure, or have a multi-layered structure in which layers are stacked in the thickness direction thereof. The conductive pattern having the single-layered structure may include a metal layer or a transparent conductive layer. The metal layer may include molybdenum, silver, titanium, copper, aluminum, and alloys thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include PEDOT, metal nano wire, and graphene.

The conductive pattern having the multi-layered structure may include multi-layered metal layers. The multi-layered metal layers may have, for example, a triple layered structure of titanium/aluminum/titanium. The conductive pattern having the multi-layered structure may include a single-layered metal layer and a transparent conductive layer. The conductive pattern having the multi-layered structure may include multi-layered metal layers and a transparent conductive layer.

In an embodiment, each of the first and second conductive patterns CP1 and CP2 may include sensor patterns and sensing lines.

An intermediate insulating layer in the form of the touch insulating layer INS is disposed between the first and second conductive patterns CP1 and CP2. The touch insulating layer INS may include an inorganic insulating layer including an inorganic material or an organic insulating layer including an organic material. The inorganic insulating layer may include at least one of aluminum oxide, titanium oxide, silicon oxide or silicon nitride, silicon oxynitride, zirconium oxide, and hafnium oxide. The organic insulating layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The protective film PTF may be disposed on the second conductive pattern CP2 to cover the second conductive pattern CP2. The protective film PTF may protect the second conductive pattern CP2 from a foreign substance or the like, which may be generated during a fabricating process of the touch sensor TS. The protective film PTF may be attached onto components included in the touch sensor TS to protect the components during the fabricating process of the touch sensor TS, and be removed from the components after a series of processes are completed. The protective film PTF may be made of, for example, resin including PET having adhesion (or gluing property), etc., but exemplary embodiments are not limited thereto.

Figure 6:
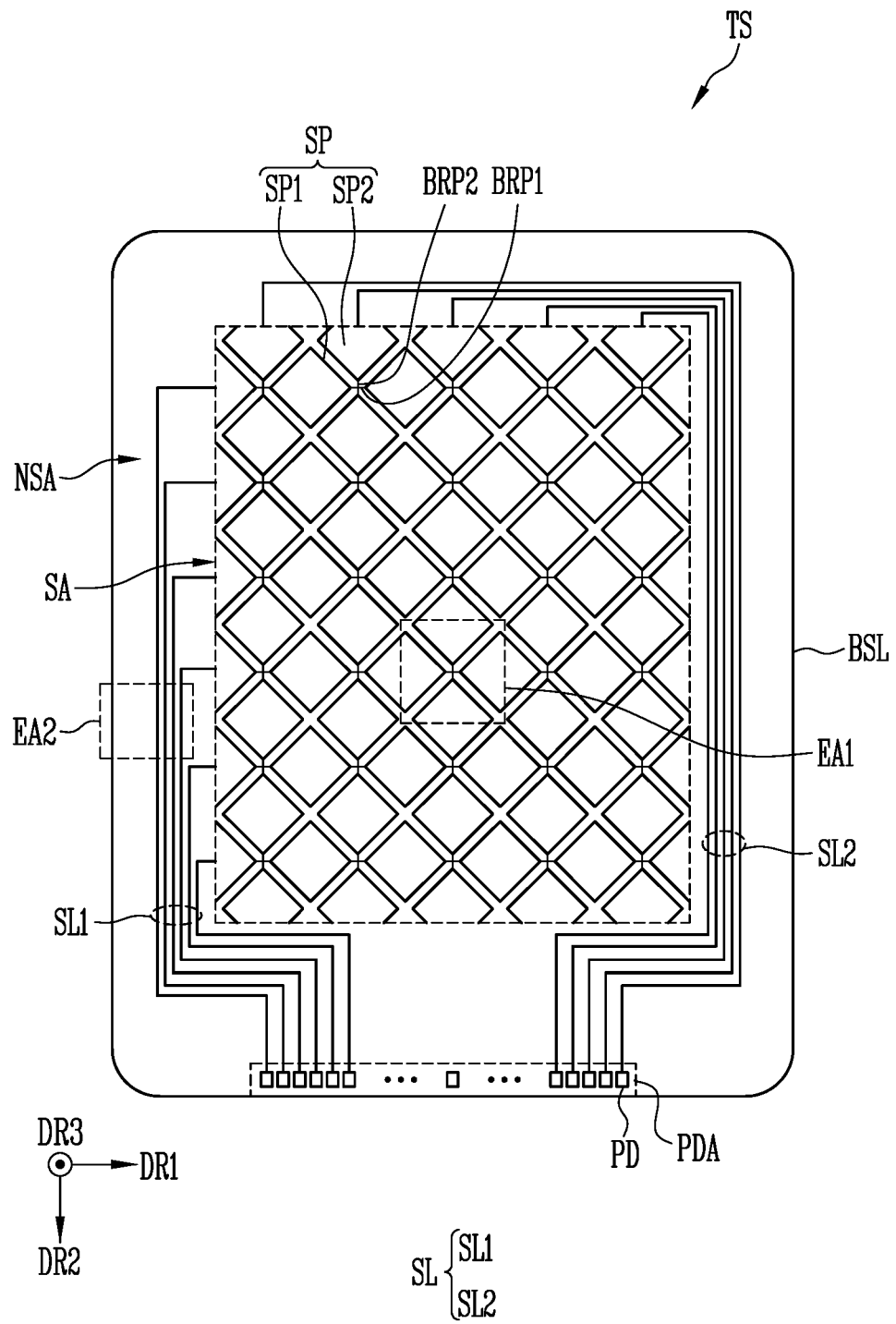
FIG. 6 is a schematic plan view of an exemplary embodiment of the touch sensor of FIG. 2.
Figure 7:
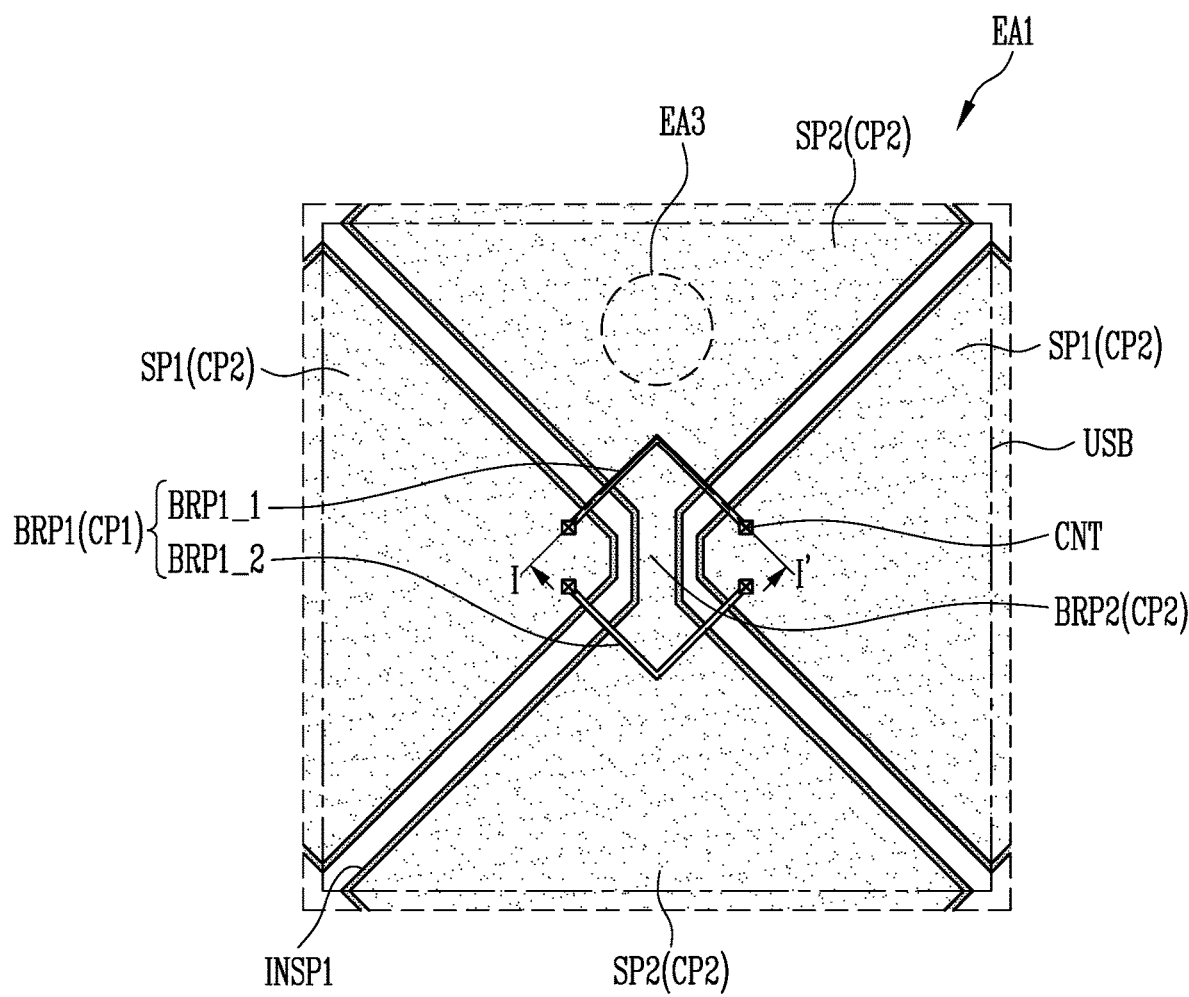
FIG. 7 is an enlarged plan view of portion EA1 of FIG. 6.
Figure 8:
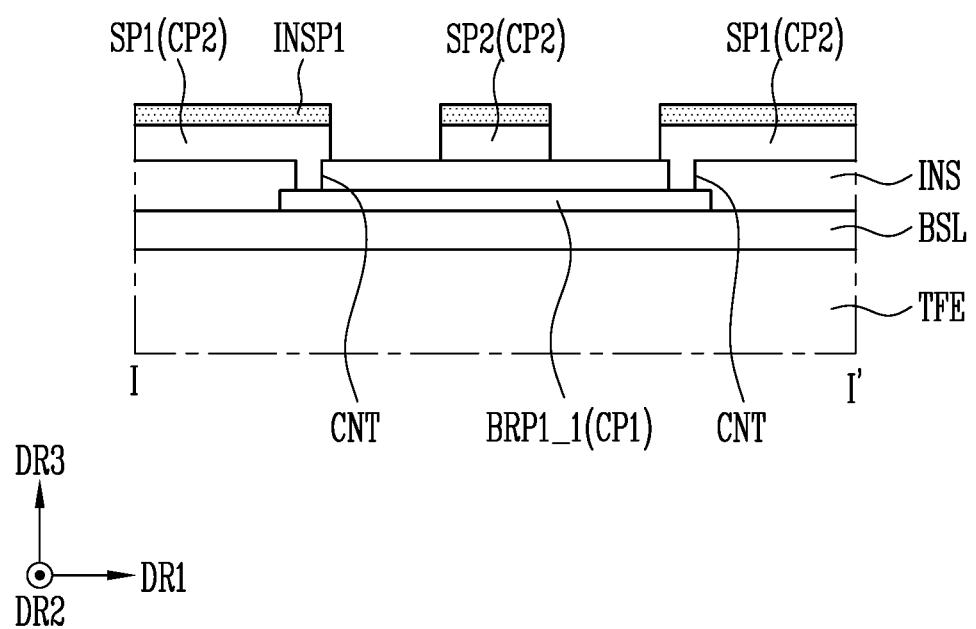
FIG. 8 is a cross-sectional view taken along line I-I' of FIG. 7.
Figure 9:
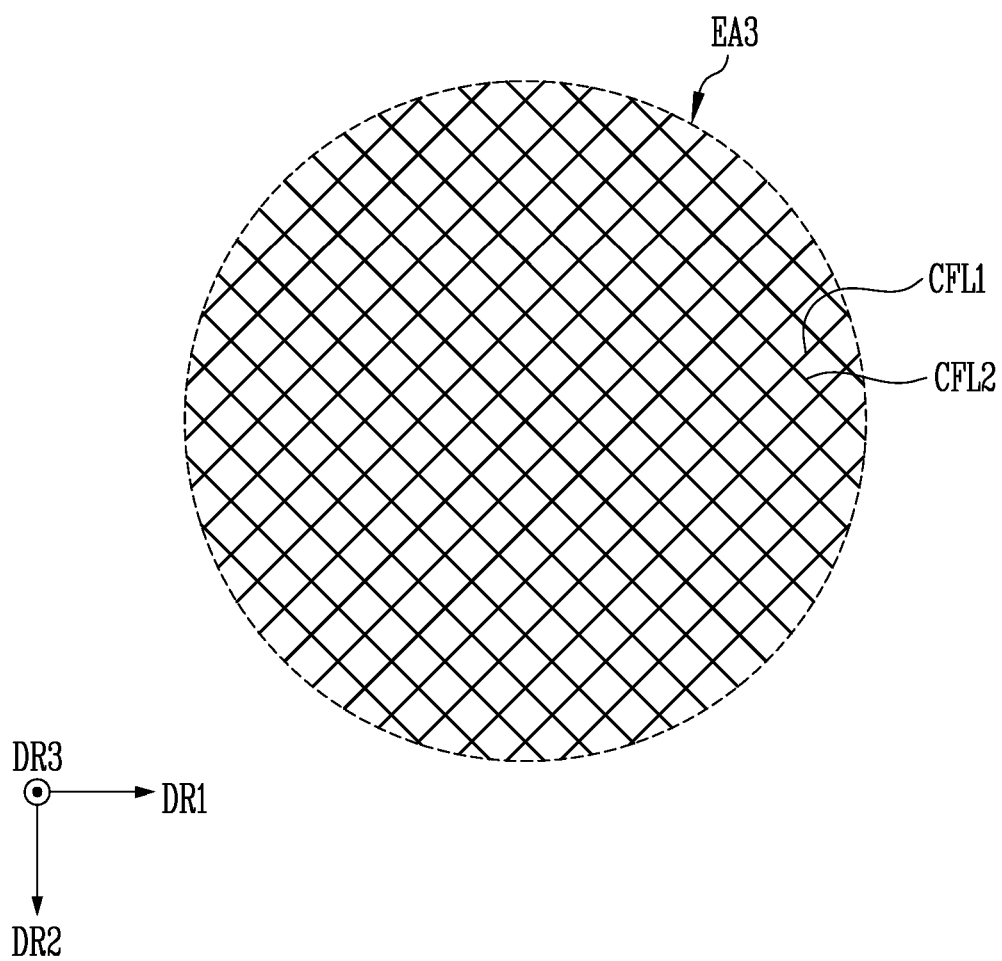
FIG. 9 is an enlarged plan view schematically illustrating portion EA3 of FIG. 7.
Figure 11A:
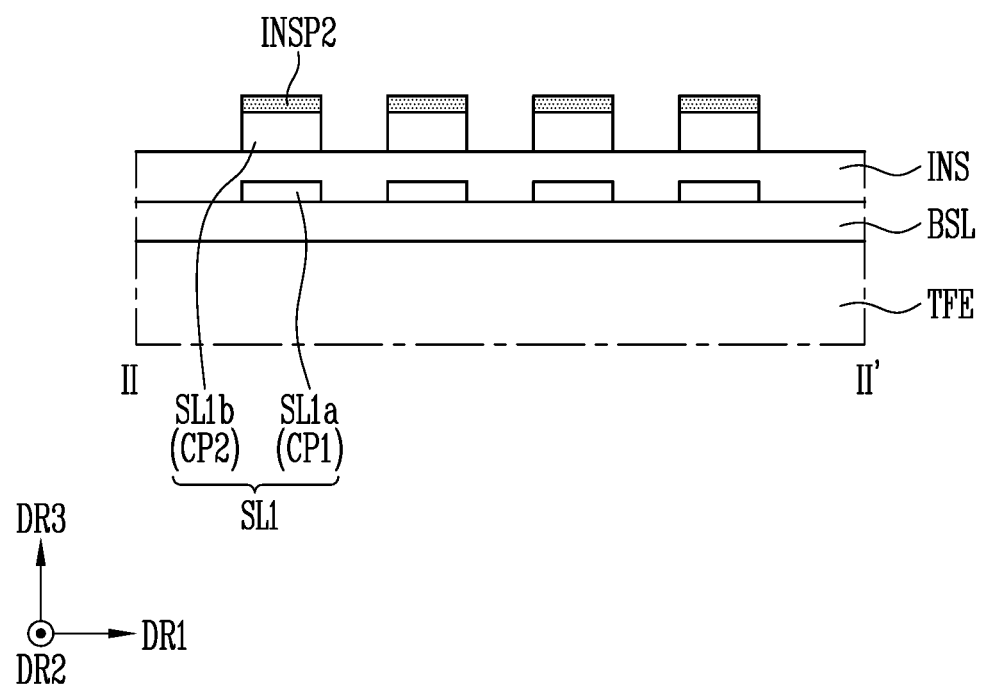
Figure 12B:
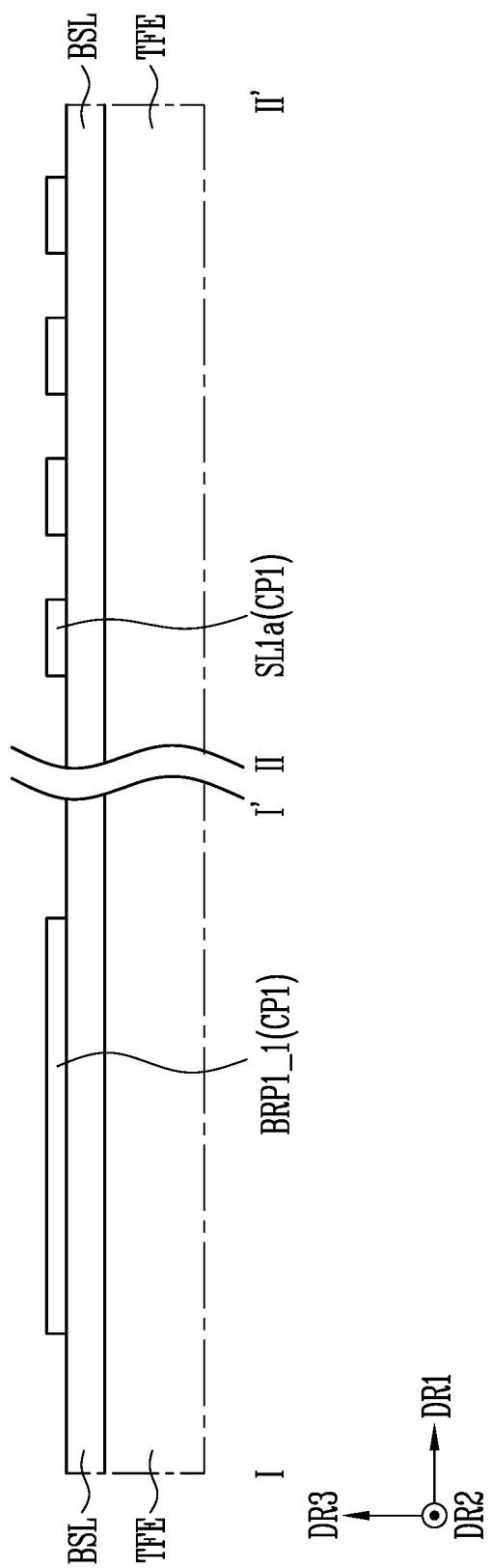
Figure 12D:
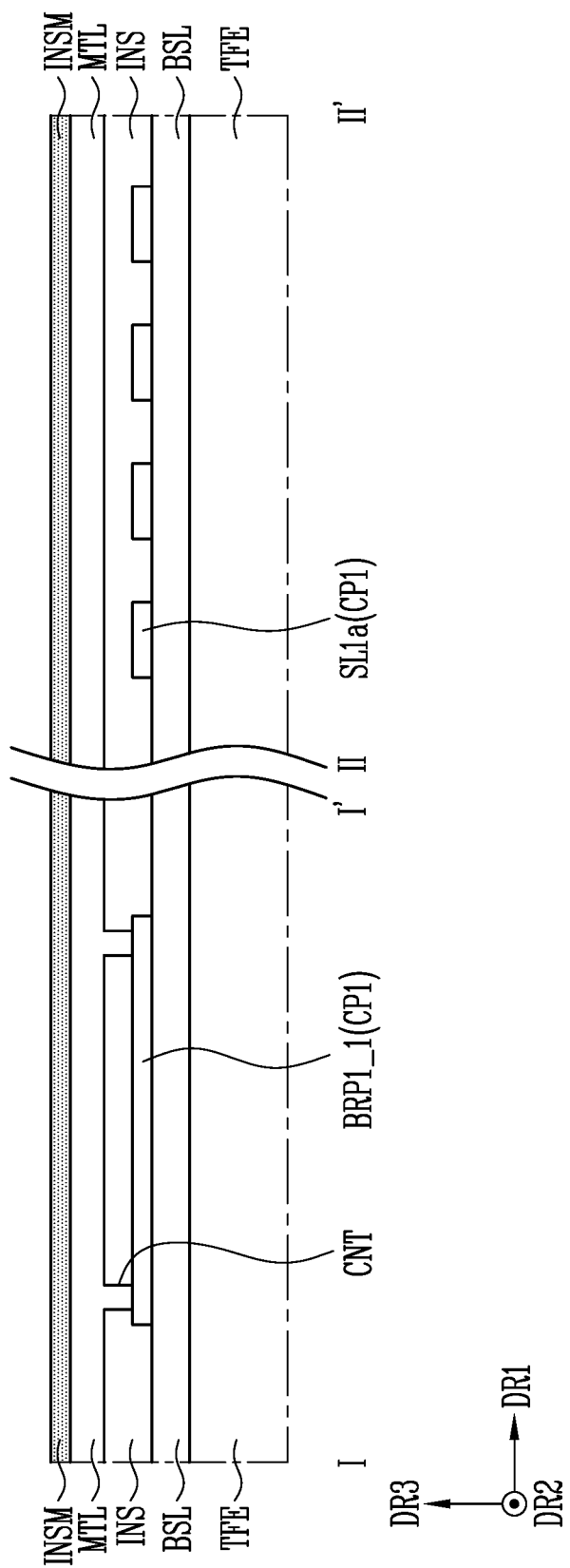
Figure 12E:
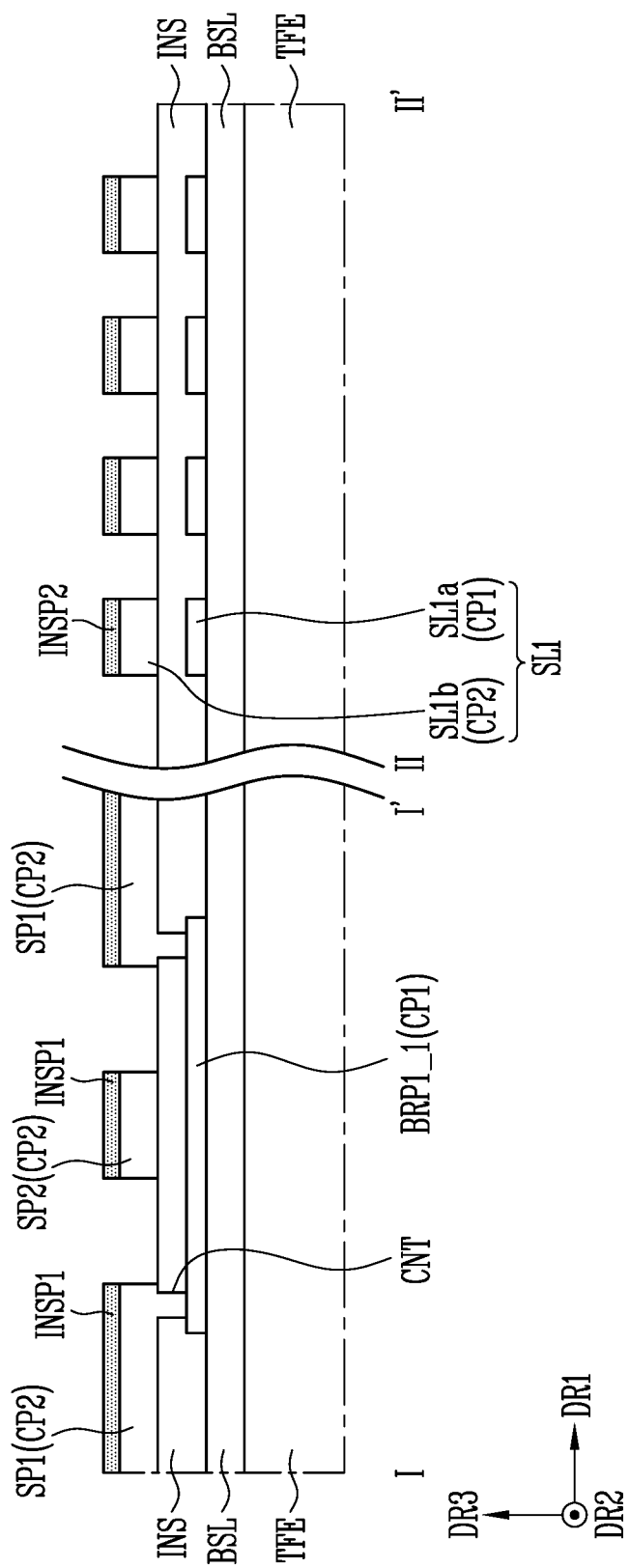

FIG. 6 is a schematic plan view of an exemplary embodiment of the touch sensor of FIG. 2. FIG. 7 is an enlarged plan view of portion EA1 of FIG. 6. FIG. 8 is a cross-sectional view taken along line I-I' of FIG. 7. FIG. 9 is an enlarged plan view schematically illustrating portion EA3 of FIG. 7. FIG. 10 is an enlarged plan view schematically illustrating portion EA2 of FIG. 6. FIGS. 11A and 11B are cross-sectional views taken along line II-II' of FIG. 10 illustrating exemplary embodiments of the touch sensor.

Referring to FIGS. 1 to 11B, the touch sensor TS may include a base layer BSL including a sensing region SA capable of sensing a touch input and a non-sensing region NSA surrounding at least a portion of the sensing region SA.

The base layer BSL may be formed of tempered glass, a transparent plastic, a transparent film, or the like. In some embodiments, the base layer BSL may be omitted.

The sensing region SA may be provided in a central region of the base layer BSL to overlap with the display region DA of the display panel DP shown in FIG. 3. The sensing region SA may be provided in a shape substantially identical to that of the display region DA, but exemplary embodiments are not limited thereto. Sensor electrodes for sensing a touch input may be provided and/or formed in the sensing region SA.

The non-sensing region NSA may be provided at an edge of the base layer BSL to overlap with the non-display region NDA of the display panel DP shown in FIG. 3. Signal lines in the form of sensing lines SL electrically connected to the sensor electrodes to receive and transfer sensing signals may be provided and/or formed in the non-sensing region NSA. In addition, a pad unit PDA connected to the sensing lines SL to be electrically connected to the sensor electrodes of the sensing region SA may be disposed in the non-sensing region NSA. The pad unit PDA may include a plurality of pads PD.

The sensor electrodes may include a plurality of sensor patterns SP and first and second bridge patterns BRP1 and BRP2.

The sensor patterns SP may include a plurality of first sensor patterns SP1 and a plurality of second sensor patterns SP2 electrically insulated from the first sensor patterns SP1.

The first sensor patterns SP1 may arranged in a first direction DR1, and be electrically connected to adjacent first sensor patterns SP1 by the first bridge patterns BRP1 to constitute at least one sensor row. The second sensor patterns SP2 may be arranged in a second direction DR2 intersecting the first direction DR1, and be electrically connected to adjacent second sensor patterns SP2 by the second bridge patterns BRP2 to constitute at least one sensor column.

Each of sensor row and sensor column of the first and second sensor patterns SP1 and SP2 may be electrically connected to one pad PD through a corresponding sensing line SL.

The first sensor patterns SP1 may correspond to and/or function as driving electrodes which receive driving signals for detecting a touch position in the sensing region SA, and the second sensor patterns SP2 may correspond to and/or function as sensing electrodes which outputs sensing signals for detecting a touch position in the sensing region SA. However, exemplary embodiments are not limited thereto. The first sensor patterns SP1 may correspond to the sensing electrodes, and the second sensor patterns SP2 may correspond to the driving electrode.

In an embodiment, the touch sensor ST may recognize a touch of a user by sensing a variation in mutual capacitance formed between the first and second sensor patterns SP1 and SP2.

In an embodiment, each of the second sensor patterns SP2 may include a plurality of conductive fine lines CFL1 and CFL2 as shown in FIG. 9. In an example, each of the second sensor patterns SP2 may include a plurality of first conductive fine lines CFL1 which extend in a direction oblique to the first direction DR1 and are substantially parallel to each other and a plurality of second conductive fine lines CFL2 which extend in a direction oblique to the second direction D2 and are substantially parallel to each other. Each of the second sensor patterns SP2 may have a mesh structure due to the first conductive fine lines CFL1 and the second conductive fine lines CFL2. The mesh structure may include a plurality of openings, e.g., regions formed when the first conductive fine lines CFL1 and the second conductive fine lines CFL2 intersect each other.

While a case where each of the second sensor patterns SP2 has a mesh structure is illustrated in the drawings, exemplary embodiments are not limited thereto. For example, the first sensor patterns SP1 and the first and second bridge patterns BRP1 and BRP2 may also have a mesh structure including conductive fine lines such as the first and second conductive fine lines CFL1 and CFL2.

Each of the first bridge patterns BRP1 is used to electrically connect first sensor patterns SP1 arranged in the first direction DR1, and may be provided in a shape extending along the first direction DR1. Each of the first bridge patterns BRP1 may include a (1-1)th bridge pattern BRP1_1 and a (1-2)th bridge pattern BRP1_2.

Each of the second bridge patterns BRP2 is used to electrically connect second sensor patterns SP2 arranged in the second direction DR2, and may be provided in a shape extending along the second direction DR2. In an embodiment, each of the second bridge patterns BRP2 may be integrally provided with second sensor patterns SP2. When each of the is second bridge patterns BRP2 is integrally provided with second sensor patterns SP2, the second bridge pattern BRP2 may be portion of the second sensor patterns SP2.

The touch sensor TS may include a first conductive pattern CP1 provided on the base layer BSL, a touch insulating layer INS provided on the first conductive pattern CP1, and a second conductive pattern CP2 provided on the touch insulating layer INS.

The base layer BSL may be disposed on the thin film encapsulation layer TFE of the display panel DP shown in FIG. 4B. In some embodiments, the base layer BSL may be an uppermost layer of the thin film encapsulation layer TFE of the display panel DP. For example, the base layer BSL may be an inorganic insulating layer (or inorganic layer) as the uppermost layer of the thin film encapsulation layer TFE. In some embodiments, the base layer BSL may be an inorganic insulating layer (inorganic buffer layer) additionally disposed on the thin film encapsulation layer TFE. For example, the base layer BSL may include a silicon nitride layer, a silicon oxynitride layer, a silicon oxide layer, a titanium oxide layer, an aluminum oxide layer, or the like.

The first conductive pattern CP1 may be directly disposed on the base layer BSL. In some embodiments, the first conductive pattern CP1 may overlap with the pixel defining layer PDL shown in FIG. 4B. In an embodiment, the first conductive pattern CP1 may include the first bridge patterns BRP1 as shown in FIG. 8.

The first conductive pattern CP1 may include a conductive material. The conductive material may include a transparent conductive oxide or a metallic material. Also, the first conductive pattern CP1 may include a plurality of stacked metal layers. Examples of the transparent conductive oxide may be Indium Tin Oxide (ITO), Indium Zinc Oxide (IZO), Antimony Zinc Oxide (AZO), Indium Tin Zinc Oxide (ITZO), Zinc Oxide (ZnO), tin oxide ($SnO_2$), and the like. Examples of the metallic material may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. The first conductive pattern CP1 may have a single- or multi-layered structure.

The touch insulating layer INS may be disposed and/or formed on the first conductive pattern CP1. The touch insulating layer INS may include the same material as the base layer BSL, but exemplary embodiments are not limited thereto. In an embodiment, the touch insulating layer INS may include an organic insulating layer including an organic material or an inorganic insulating layer including an inorganic material. The touch insulating layer INS may have the same configuration as the touch insulating layer INS described with reference to FIG. 5.

Like the first conductive pattern CP1, the second conductive pattern CP2 may include a single conductive material layer, or include a plurality of stacked conductive material layers. The second conductive pattern CP2 may include the first and second sensor patterns SP1 and SP2 and the second bridge patterns BRP2, which are provided on the touch insulating layer INS, as shown in FIG. 8. The first sensor patterns SP1 adjacent in the first direction DR1 may be electrically and/or physically connected to each other by the first bridge patterns BRP1 through contact holes CNT penetrating the touch insulating layer INS.

In the above-described embodiment, a case where the first bridge patterns BRP1 are included in the first conductive pattern CP1, and the first and second sensor patterns SP1 and SP2 and the second bridge patterns BRP2 are included in the second conductive pattern CP2 is described as an example, but exemplary embodiments are not limited thereto. In some embodiments, the first and second sensor patterns SP1 and SP2 and the second bridge patterns BRP2 may be included in the first conductive pattern CP1, and the first bridge patterns BRP1 may be included in the second conductive pattern CP2.

Also, in the above-described embodiment, a case where the first conductive pattern CP1 is disposed on the base layer BSL, and the second conductive pattern CP2 is disposed on the touch insulating layer INS is described as an example, but exemplary embodiments are not limited thereto. In some embodiments, the first conductive pattern CP1 may be disposed on the touch insulating layer INS, and the second conductive pattern CP2 may be disposed on the base layer BSL.

Also, in the above-described embodiment, a case where the first and second sensor patterns SP1 and SP2 are provided in the same layer is described as an example, but exemplary embodiments are not limited thereto. In some embodiments, the first sensor patterns SP1 and the second sensor patterns SP2 may be provided in different layers.

The sensor electrodes provided and/or formed in the sensing region SA may include dummy electrodes disposed to be spaced apart from each other between the first and second sensor patterns SP1 and SP2. The dummy electrodes are floating electrodes, and are not electrically connected to the first sensor patterns SP1 and the second sensor patterns SP2. The dummy electrodes are disposed in the sensing region SA, so that a boundary region between the first sensor patterns SP1 and the second sensor patterns SP2 is not visible to a user. Further, a fringe effect between the first sensor patterns SP1 and the second sensor patterns SP2 can be controlled by adjusting the width and thickness of the dummy electrodes, and capacitance between the first sensor patterns SP1 and the second sensor patterns SP2 can be optimized.

The touch sensor TS may be formed through repeated arrangement of a unit sensor block USB as shown in FIGS. 6 and 7. The unit sensor block USB may be a virtual unit block having a certain area, which includes at least some of sensor patterns SP adjacent in the first direction DR1 and at least some of sensor patterns SP adjacent in the second direction DR2 in a corresponding sensing region. It will be understood that the unit sensor block USB corresponds to a minimum repetition unit in the arrangement of the sensor patterns SP in the corresponding sensing region.

In an embodiment, the sensing lines SL may include a plurality of first sensing lines SL1 connected to the first sensor patterns SP1 and a plurality of second sensing lines SL2 connected to the second sensor patterns SP2.

The first sensing lines SL1 may be connected to the first sensor patterns SP1. Each of the first sensing lines SL1 may be connected to one sensor row of the first sensor patterns SP1 arranged along the first direction DR1.

The second sensing lines SL2 may be connected to the second sensor patterns SP2. Each of the second sensing lines SL2 may be connected to one sensor column of the second sensor patterns SP2 arranged along the second direction DR2.

The first and second sensing lines SL1 and SL2 may be made of a conductive material. The conductive material may include metals, alloys thereof, conductive polymer, conductive metal oxide, a nano conductive material, and the like. In an embodiment, examples of the metals may be copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like. Examples of the conductive polymer may be a polythiophene-based compound, a polypyrrole-based compound, a polyaniline-based compound, a polyacetylene-based compound, a polyphenylene-based compound, mixtures thereof, etc. In particular, a PEDOT/PSS compound may be used as the polythiophene-based compound. Examples of the conductive metal oxide may be Indium Tin Oxide (ITO), Indium Zinc Oxide (IZO), Antimony Zinc Oxide (AZO), Indium Tin Zinc Oxide (ITZO), Zinc Oxide (ZnO), tin oxide ($SnO_2$), and the like. In addition, examples of the nano conductive material may be a silver nano-wire (AgNW), a carbon nano-tube, grapheme, and the like.

In an embodiment, the first sensing lines SL1 may be configured in a double layer including a first metal layer SL1$a$ included in the first conductive pattern CP1 and a second metal layer SL1$b$ included in the second conductive pattern CP2 as shown in FIG. 11A. The second metal layer SL1$b$ may be provided and/or formed on the first metal layer SL1$a$ with the touch insulating layer INS interposed therebetween. When viewed in plan, the first metal layer SL1$a$ and the second metal layer SL1$b$ may overlap with each other. The first metal layer SL1$a$ and the second metal layer SL1$b$ may be electrically connected to each other through a contact hole penetrating the touch insulating layer INS.

While a case where each of the first sensing lines SL1 is configured in the double layer including the first metal layer SL1$a$ and the second metal layer SL1$b$ has been described in the above-described embodiment, exemplary embodiments are not limited thereto. For example, the first sensing lines SL1 may be configured in a single layer included in the second conductive pattern CP2 as shown in FIG. 11B. Similar to the first sensing lines SL1, each of the second sensing lines SL2 may also be configured in a double layer including one metal layer included in the first conductive pattern CP1 and another metal layer included in the second conductive pattern CP2, the metal layers overlapping and being connected to each other.

Each of the first sensor patterns SP1 may be applied with a driving signal for touch sensing through a corresponding first sensing line SL1, and each of the second sensor patterns SP2 may transfer a touch sensing signal through a corresponding second sensing line SL2. However, exemplary embodiments are not limited thereto, and the opposite case is possible.

The touch sensor TS may include a first insulating layer which may be in the form of an insulating pattern INSP1 provided and/or formed on the sensor patterns SP and a second insulating layer which may be in the form of an insulating pattern INSP2 provided and/or formed or the sensing lines SL. In an embodiment, the first insulating pattern INSP1 and the second insulating pattern INSP2 may be provided and/or formed in the same layer, include the same material, and be formed through the same fabricating process.

The first insulating pattern INSP1 and the second insulating pattern INSP2 may include the same material as the touch insulating layer INS. In an example, the first and second insulating patterns INSP1 and INSP2 may include an inorganic insulating layer including an inorganic material or an organic insulating layer including an organic material. The inorganic insulating layer may include at least one of aluminum oxide, titanium oxide, silicon oxide or silicon nitride, silicon oxynitride, zirconium oxide, and hafnium oxide. The organic insulating layer may include at least one of acryl-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin.

The first insulating pattern INSP1 may be located in the sensing region SA, and the second insulating pattern INSP2 may be located in the non-sensing region NSA.

In an embodiment, the first insulating pattern INSP1 may be directly disposed and/or formed on the sensor patterns SP included in the second conductive pattern CP2. In an example, the first insulating pattern INSP1 may be respectively disposed and/or formed on the first sensor patterns SP1, the second sensor patterns SP2, and the second bridge patterns BRP2.

The first insulating pattern INSP1 may overlap with the sensor patterns SP included in the second conductive pattern CP2 when viewed in plan. In an example, the first insulating pattern INSP1 may have substantially the same planar shape as each of the first sensor patterns SP1, the second sensor patterns SP2, and the second bridge patterns BRP2. That is, the first insulating pattern INSP1 on the first sensor patterns SP1 may have substantially the same planar shape as each of the first sensor patterns SP1, the first insulating pattern INSP1 on the second sensor patterns SP2 may have substantially the same planar shape as each of the second sensor patterns SP2, and the first insulating pattern INSP1 on the second bridge patterns BRP2 may have substantially the same planar shape as each of the second bridge patterns BRP2. For example, when each of the first sensor patterns SP1 has a generally diamond planar shape, the first insulating pattern INSP1 provided on the top of the first sensor pattern SP1 may have a generally diamond planar shape.

The first insulating pattern INSP1 disposed on each of the first sensor patterns SP1 may be spaced apart from the first insulating pattern INSP1 provided on each of the second sensor patterns SP2 in the sensing region SA. The first insulating pattern INSP1 disposed on each of the second bridge patterns BRP2 may be integrally provided with the first insulating pattern INSP1 provided on each of the second sensor patterns SP2.

The second insulating pattern INSP2 may be directly disposed and/or formed on the sensing lines SL included in the second conductive pattern CP2. In an example, the second insulating pattern INSP2 may be directly disposed and/or formed on the second metal layer SL1b of each of the first sensing lines SL1. Also, the second insulating pattern INSP2 may be directly disposed and/or formed on the second metal layer of each of the second sensing lines SL2.

The second insulating pattern INSP2 may overlap with each of the first sensing lines SL1 when viewed in plan. In an example, the second insulating pattern INSP2 may have substantially the same planar shape as each of the first sensing lines SL1. In some embodiments, when each of the first sensing lines SL1 has an elongate bar-type planar shape extending in a specific direction, the second insulating pattern INSP2 provided on the top of the first sensing line SL1 may also have an elongate bar-type planar shape to correspond to that of the first sensing line SL1. In addition, when each of the second sensing lines SL2 has an elongate bar-type planar shape extending in a specific direction, the second insulating pattern INSP2 provided on the top of the second sensing line SL2 may also have an elongate bar-type planar shape corresponding to that of the second sensing line SL1.

In an embodiment, the first insulating pattern INSP1 may be formed through the same process as each of the first sensor patterns SP1, the second sensor patterns SP2, and the second bridge patterns BRP2, which are included in the second conductive pattern CP2. In an example, the second conductive pattern CP2 and the first insulating pattern INSP1 located on the top thereof may be simultaneously formed by performing a process using a mask on a metal layer and an insulating material layer sequentially stacked on the touch insulating layer INS in the sensing region SA. At the same time, the second conductive pattern CP2 and the second insulating pattern INSP2 located on the top thereof may be simultaneously formed by performing a process using the mask on a metal layer and an insulating material layer sequentially stacked on the touch insulating layer INS in the non-sensing region NSA. The metal layer and the insulating material layer in the sensing region SA and the metal layer and the insulating material layer in the non-sensing region NSA are the same components.

The first insulating pattern INSP1 may in direct contact at least a portion of each of the first sensor patterns SP1, the second sensor patterns SP2, and the second bridge patterns BRP2. In an example, the first insulating pattern INSP1 on the first sensor patterns SP1 may be disposed on only an upper surface of each of the sensor patterns SP1 to be in direct contact to the upper surface. The first insulating pattern INSP1 on the first sensor patterns SP1 may not be disposed on either side surface of each of the first sensor pattern SP1 so as not to be in contact with either of the side surfaces. The first insulating pattern INSP1 on the second sensor patterns SP2 may be directly disposed on only an upper surface of each of the second sensor patterns SP2 to be in direct contact with the upper surface. The first insulating pattern INSP1 on the second sensor patterns SP2 may not be disposed on either side surface of each of the second sensor patterns SP2 so as not to be in contact with either of the side surfaces. The first insulating pattern INSP1 on the second bridge patterns BRP2 may be directly disposed on only an upper surface of each of the second bridge patterns BRP2 to be in direct contact with the upper surface. The first insulating pattern INSP1 on the second bridge patterns BRP2 may not be disposed on either side surface of each of the second bridge patterns BRP2 so as not to be in contact with either of the side surfaces.

The second insulating pattern INSP2 may be in contact with at least a portion of the second metal layer SL1b of the first sensing lines SL1 and at least a portion of the second metal layer of the second sensing lines SL2. In an example, the second insulating pattern INSP2 on the second metal layer SL1b of each of the first sensing lines SL1 may be directly disposed on only an upper surface of the second metal layer SL1b to be in direct contact with the upper surface. The second insulating pattern INSP2 on the second metal layer SL1b of each of the first sensing lines SL1 may not be disposed on either side surface of the second metal layer SL1b so as not to be in contact with both the side surfaces. The second insulating pattern INSP2 on the second metal layer of each of the second sensing lines SL2 may be directly disposed on only an upper surface of the second metal layer of each of the second sensing lines SL2 to be in direct contact with the upper surface. The second insulating pattern INSP2 on the second metal layer of each of the second sensing lines SL2 may not be disposed on either side surface of the second metal layer of each of the second sensing lines SL2 so as not to be in contact with both the side surfaces.

Each of the first insulating pattern INSP1 and the second insulating pattern INSP2 may cover and thereby protect components disposed below the insulating patterns. In an example, the first insulating pattern INSP1 may protect each of the first sensor patterns SP1, the second sensor patterns SP2, and the second bridge patterns BRP2, which are disposed therebelow, so that a failure caused by a foreign substance, defect, etc., being formed or deposited in the sensitive electronic components during the fabricating process of the touch sensor TS can be prevented. The second insulating pattern INSP2 may protect each of the sensing lines SL disposed therebelow, so that a failure caused by the foreign substance, defect, etc., being formed or deposited on the sensing line can be prevented.

In some embodiments, in the touch sensor TS, after the second conductive pattern CP2 is formed on the touch insulating layer INS, another insulating layer, e.g., an organic insulating layer provided on substantially the entire top of the second conductive pattern CP2 may be skipped so as to achieve simplification of process and cost reduction. For example, a subsequent process may be performed after forming the second conductive pattern CP2 and then attaching a protective film such as the protective film PTF shown in FIG. 5 onto the second conductive pattern CP2. When a cutting process using a laser beam is performed to change the shape of the touch sensor TS, the protective film PTF located at a portion on which the cutting process is performed may be damaged and separated from other components such as the second conductive pattern CP2 as a portion of the protective film PTF is removed by heat of the laser beam. Therefore, a gap may be generated. A foreign substance (e.g., a carbide substance) generated in the cutting process may be introduced through the gap and then attached to the second conductive pattern CP2. In this case, a failure such as a short-circuit failure of the second conductive pattern CP2, may occur due to the foreign substance attached to the second conductive pattern CP2.

In addition, when the protective film PTF is removed, a surface of the second conductive pattern CP2, which is a surface to be attached, may be damaged, or an adhesive (or gluing agent) may remain on the surface. In this case, a failure such as a short-circuit failure of the second conductive pattern CP2 may occur.

According to exemplary embodiments, the first and second insulating patterns INSP1 and INSP2 are formed on the top of the second conductive pattern CP2 through the same process as the second conductive pattern CP2, so that a failure such as a short-circuit failure of the second conductive pattern CP2, which is caused by a foreign substance or other defect occurring in the fabricating process of the touch sensor TS, can be prevented while protecting the second conductive pattern CP2.

FIGS. 12A to 12E are schematic cross-sectional views sequentially illustrating an exemplary embodiment of a touch sensor at some of the processes of fabricating the touch sensor according to the principles of the invention.

Referring to FIGS. 1 to 12A, a base layer BSL is formed on the thin film encapsulation layer TFE. The base layer BSL may be an inorganic insulating layer including an inorganic material. In an example, the base layer BSL may be made of nitride (SiNx).

Subsequently, referring to FIGS. 1 to 12B, a first conductive pattern CP1 is formed on the base layer BSL. The first conductive pattern CP1 may include a (1-1)th bridge pattern BRP1_1 located in the sensing region SA and a first metal layer SL1*a* located in the non-sensing region NSA. In an example, each of the (1-1)th bridge pattern BRP1_1 and the first metal layer SL1*a* may be provided in a multi-layer in which titanium (Ti)/aluminum (Al)/titanium (Ti) are sequentially stacked.

Referring to FIGS. 1 to 12C, a touch insulating layer INS including a contact hole CNT exposing a portion of the (1-1)th bridge pattern BRP1_1 is formed over the first conductive pattern CP1. The touch insulating layer INS may be provided throughout the sensing region SA and the non-sensing region NSA. The touch insulating layer INS may be an inorganic insulating layer including an inorganic material. In an example, the touch insulating layer INS may be made of silicon nitride (SiNx).

Referring to FIGS. 1 to 12D, a metal layer MTL and an insulating material layer INSM are sequentially stacked on the touch insulating layer INS. The insulating material layer INSM is located on the metal layer MTL.

The metal layer MTL may be provided in a multi-layer in which titanium (Ti)/aluminum (Al)/titanium (Ti) are sequentially stacked. The insulating material layer INSM may be an inorganic insulating layer including an inorganic material or an organic insulating layer including an organic material.

Referring to FIGS. 1 to 12E, a second conductive pattern CP2 and first and second insulating patterns INSP1 and INSP2 located on the top thereof are formed simultaneously through the same process. The second conductive pattern CP2 and the first and second insulating patterns INSP1 and INSP2 are formed by disposing a mask on the top of the insulating material layer INSM and then sequentially performing a photo process, an etching process, and a strip process. The etching process may be a dry etching process. Through the above-described processes, each of the first and second insulating patterns INSP1 and INSP2 may be formed on an upper surface of a corresponding second conductive pattern CP2.

The second conductive pattern CP2 may include each first sensor pattern SP1 and each second sensor pattern SP2, which are located in the sensing region SA, and include a second metal layer SL1*b* of each first sensing line SL1 located in the non-sensing region NSA. Also, the second conductive pattern CP2 may include each second bridge pattern BRP2 located in the sensing region SA, and include a second metal layer of each second sensing line SL2 located in the non-sensing region NSA.

The first insulating pattern INSP1 is disposed on each of upper surfaces of the first sensor patterns SP1, upper surfaces of the second sensor patterns SP2, and upper surfaces of the second bridge patterns BRP2. The second insulating pattern INSP2 is disposed on the second metal layer SL1*b* of each of the first sensing lines SL1 and the second metal layer of each of the second sensing lines SL2.

After the first and second insulating patterns INSP1 and INSP2 and the second conductive pattern CP2 are simultaneously formed, the protective film PTF shown in FIG. 5 is attached onto the top of the first and second insulating patterns INSP1 and INSP2 and then a subsequent process may be performed. In an example, the subsequent process may be a shape cutting process using a laser beam. When the shape cutting process is performed using the laser beam, a gap may be generated between the protective film PTF and a surface attached to the protective film PTF while a portion of the protective film PTF is being removed. In this case, a foreign substance may be introduced through the gap and may be attached onto a surface such as the first and second insulating patterns INSP1 and INSP2. Also, the foreign substance may be attached onto both side surfaces of the second conductive pattern CP2, which are not covered by the first and second insulating patterns INSP1 and INSP2.

Subsequently, a cleaning process is performed after the protective film PTF is removed. The foreign substance may be removed in the cleaning process. If the first and second insulating patterns INSP1 and INSP2 are not provided on the second conductive pattern CP2, the foreign substance may be directly attached to the upper surface of the second conductive pattern CP2 since the upper surface of the second conductive pattern CP2 has an area relatively wider than that of both the side surfaces of the second conductive pattern CP2. In this case, the foreign substance may not be easily removed through the cleaning process. According to exemplary embodiments, the first and second insulating patterns INSP1 and INSP2 are formed on the upper surface of the second conductive pattern CP2, so that the foreign substance can be prevented from being attached onto the upper surface of the second conductive pattern CP2. In an exemplary embodiment, the first and second insulating patterns INSP1 and INSP2 are formed on only the upper surface of the second conductive pattern CP2, not on the side surfaces of the second conductive pattern CP2.

Figure 13:
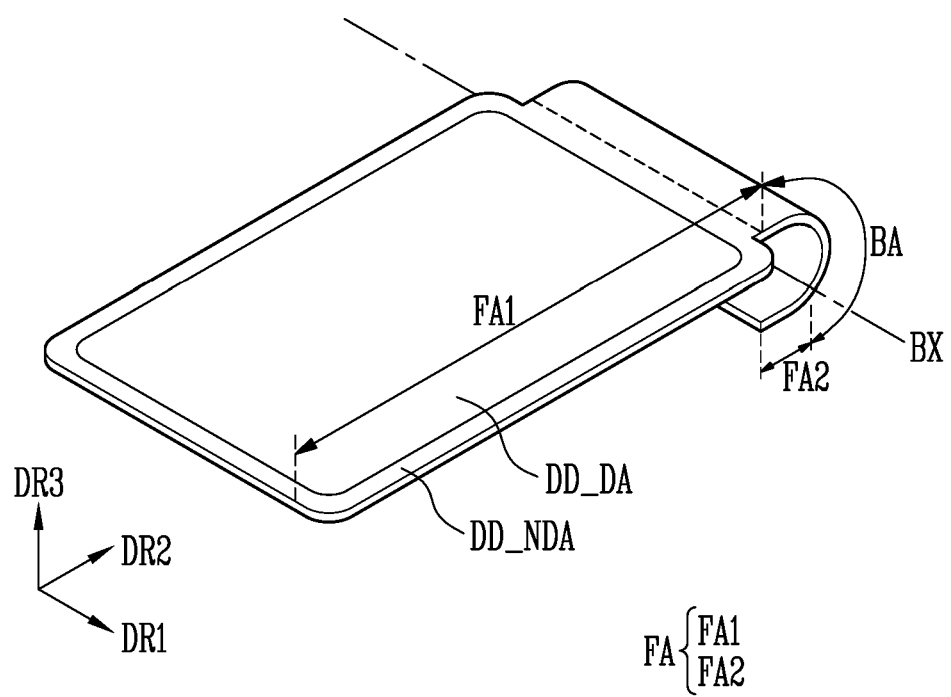
FIG. 13 is a perspective view of another exemplary embodiment of a display device constructed according to the principles of the invention.
Figure 14:
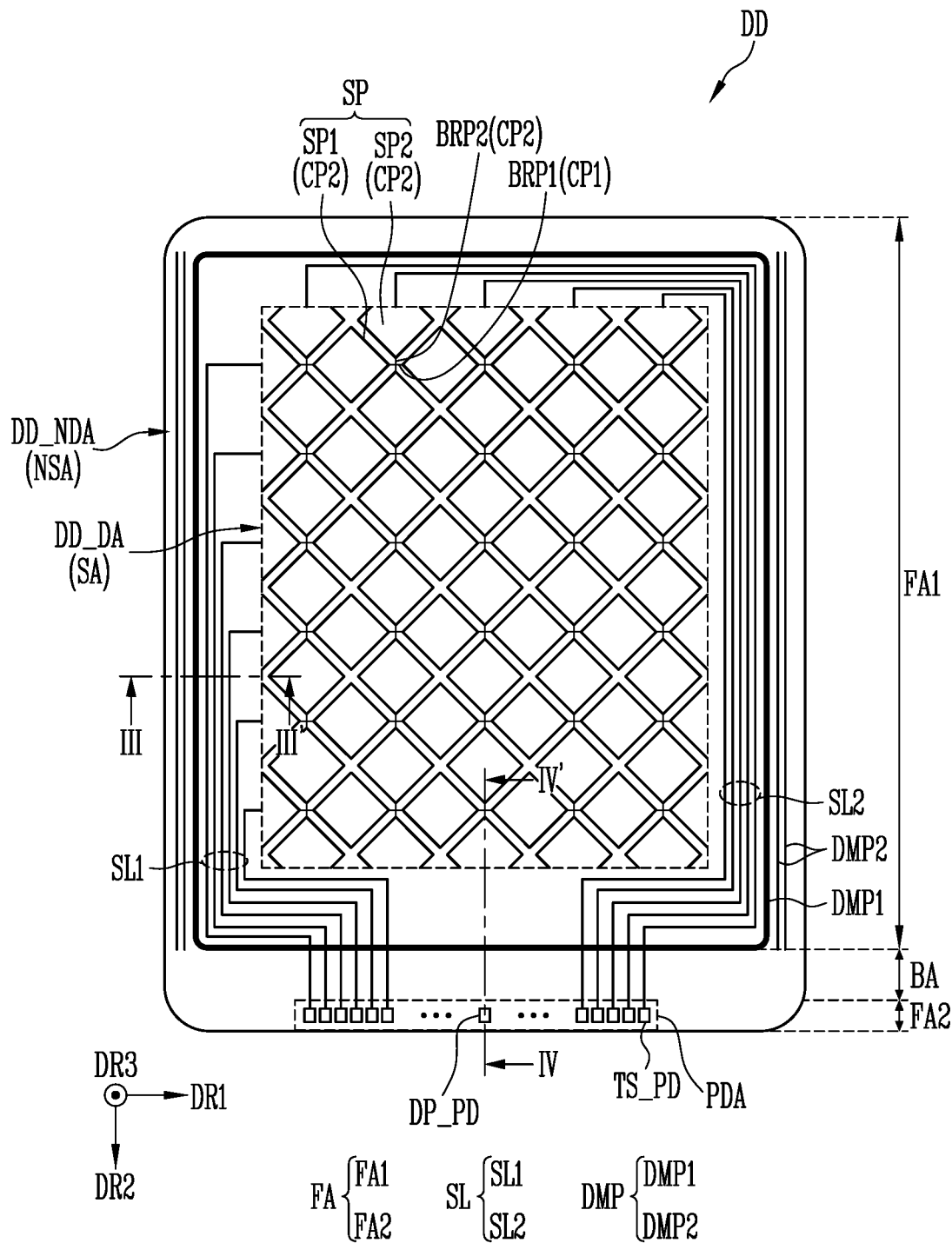
FIG. 14 is a plan view of the display device of FIG. 13.
Figure 15:
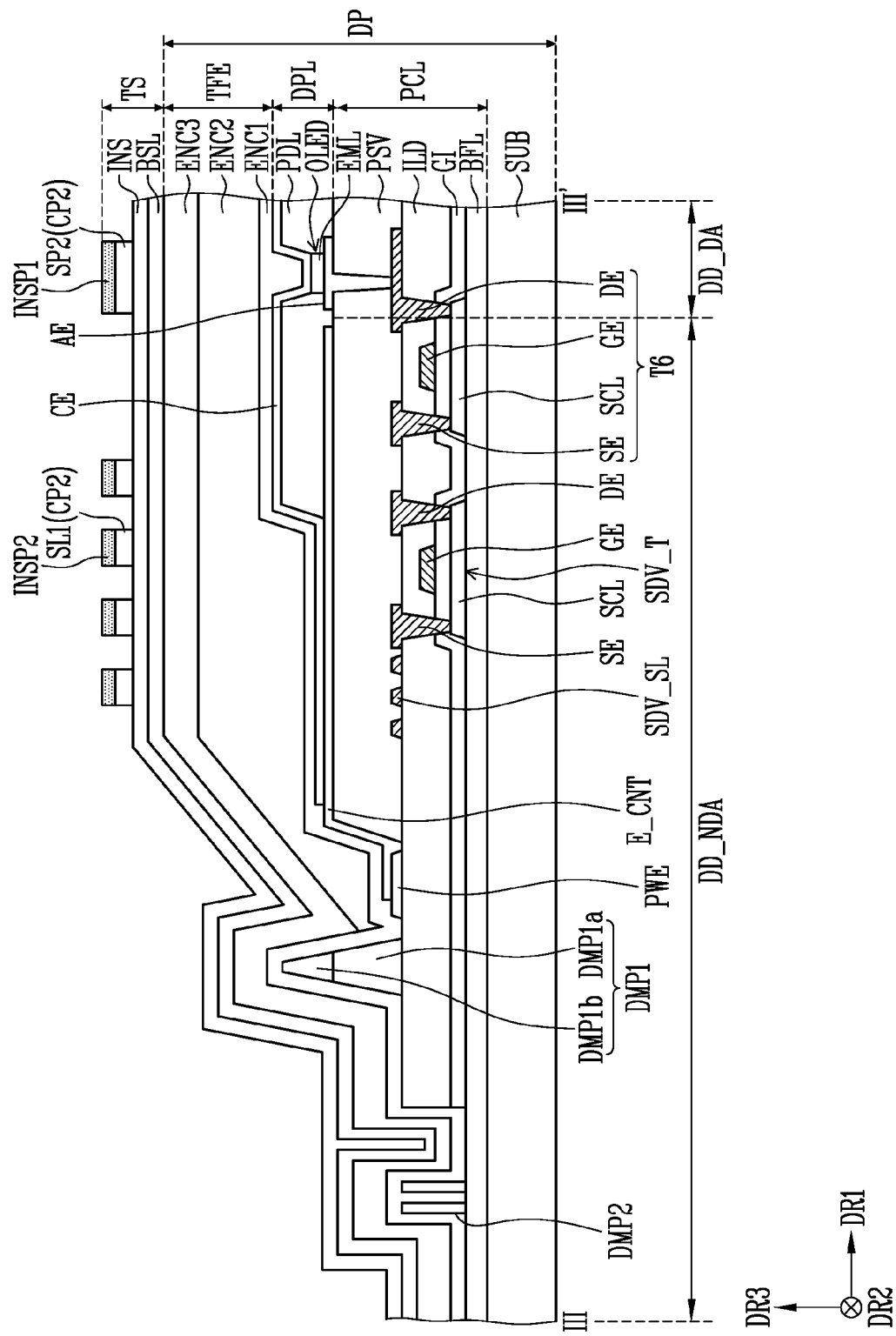
FIG. 15 is a sectional view taken along line III-III' of FIG. 14.
Figure 16:
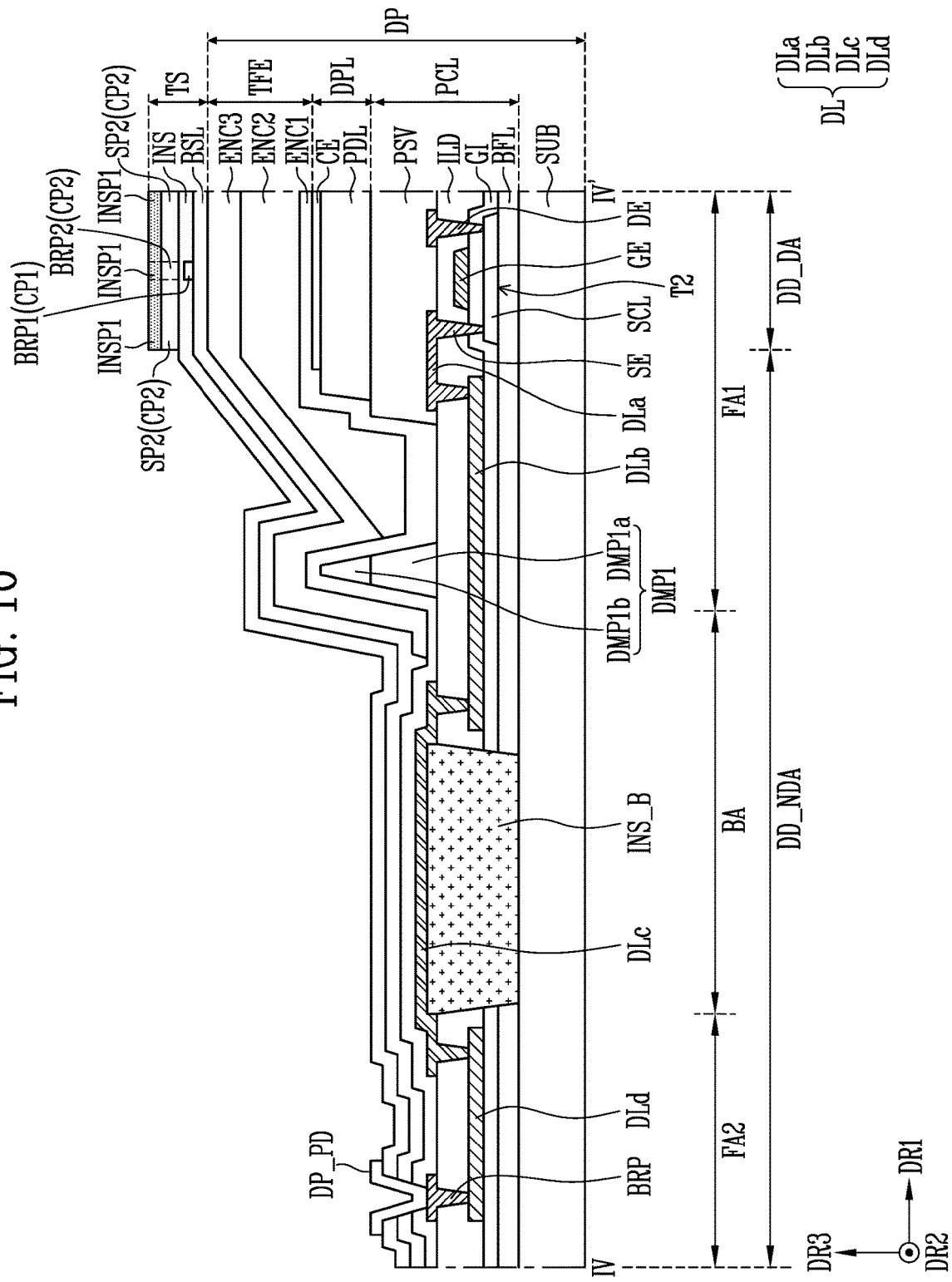
FIG. 16 is a sectional view taken along line IV-IV' of FIG. 14.

FIG. 13 is a perspective view of another exemplary embodiment of a display device constructed according to the principles of the invention. FIG. 14 is a plan view of the display device of FIG. 13. FIG. 15 is a sectional view taken along line III-III' of FIG. 14. FIG. 16 is a sectional view taken along line IV-IV' of FIG. 14. For reference, FIG. 14 illustrates, on one plane, additional components of a display panel DP and components of a touch sensor, as compared with the display panel DP shown in FIG. 3.

In relation to the display device shown in FIGS. 13 to 16, portions different from those of the above-described embodiment will be mainly described to avoid redundancy. Portions not particularly described in this embodiment follow those of the above-described embodiment. In addition, identical reference numerals refer to identical components, and similar reference numerals refer to similar components.

Referring to FIGS. 13 to 16, a display device DD may include a display panel DP and a touch sensor TS. The display device DD may further include a window.

The display device DD may include a display region DD_DA for displaying an image and a non-display region DD_NDA provided at at least one side of the display region DD_DA. The display region DD_DA may correspond to a sensing region SA of the touch sensor TS, and the non-display region DD_NDA may correspond to a non-sensing region NSA of the touch sensor TS. In an embodiment, the display region DD_DA may be a display region DA shown in FIG. 3, and the non-display region DD_NDA may be a non-display region NDA shown in FIG. 3.

At least a portion of the display device DD may have flexibility, and the display s device DD may be folded at the portion having the flexibility. In an embodiment, the term "folded" does not mean a fixed shape but means a shape deformable into another shape from the original shape, and includes a shape folded, curved, or rolled like a roll along at least one specific line, i.e., a folding line.

The display device may include a bent region BA which has flexibility and is bent in one direction and a flat region FA which is continuous at at least one side of the bent region BA and is substantially flat without being bent. The flat region FA may or may not have flexibility.

In an embodiment, a case where the bent region BA is provided in the non-display region DD_NDA is illustrated, but exemplary embodiments are not limited thereto. In some embodiment, the bent region BA may be provided in the display region DD_DA. The flat region FA may include a first substantially flat region FA1 and a second substantially flat region FA2, which are spaced apart from each other with the bent region BA interposed therebetween. The first flat region FA1 may be provided in the display region DD_DA and at least a portion of the non-display region DD_NDA. The bent region BA may be continuous to the first flat region FA1 and be provided in the non-display region DD_NDA. The second flat region FA2 may be continuous to the bent region BA and be provided in the non-display region DD_NDA. The bent region BA and the second flat region FA2 may be provided in a protruding region of the non-display region DD_NDA.

The display device DD may be provided in a state in which the display device DD is folded such that one surface of the first flat region FA1 and one surface of the second flat region FA2 are located substantially in parallel to each other and face each other, but exemplary embodiments are not limited thereto. In some embodiments, the display device DD may be s folded such that the surfaces of the first and second flat regions FA1 and FA2 form a certain angle (e.g., an acute angle, a right angle, or an obtuse angle) with the bent region BA interposed therebetween.

In an embodiment, the protruding region of the non-display region DD_NDA may be subsequently bent (or folded) along a bending axis BX. The protruding region of the non-display region DD_NDA is bent (or folded), so that the width of a bezel can be decreased.

Pixels (see PXL shown in FIG. 3) and sensor electrodes may be disposed in the display region DD_DA. A drive unit, a pad unit PDA, and sensing lines SL may be disposed in the non-display region DD_NDA. The pad unit PDA may include at least one display panel pad DP_PD electrically connected to the display panel DP and at least one touch sensor pad TS_PD is electrically connected to the touch sensor TS.

The display device DD may further include a dam part DMP which is provided in the display panel DP and is located in the non-display region DD_NDA. The dam part DMP may extend along an edge of the display region DD_DA.

The dam part DMP may be disposed in the first flat region FA1. The dam part DMP may include a first dam part DMP1 and a second dam part DMP2. The first dam part DMP1 may surround the display region DD_DA. The second dam part DMP2 may be disposed at the outside of the first dam part DMP1. The second dam part DMP2 divided into two groups spaced apart from each other in a first direction DR1 is illustrated in FIG. 14.

The first dam part DMP1 may have a double-layered structure. A lower portion DMP1a may be simultaneously formed with a passivation layer PSV, and an upper portion DMP1b may be simultaneously formed with a pixel defining layer PDL. The first dam part DMP1 may prevent a liquid organic material from flowing outward of inorganic insulating s layers, e.g., a gate insulating layer GI and an interlayer insulating layer ILD in a process of forming an organic layer included in a thin film encapsulation layer TFE.

The second dam part DMP2 may be configured as an inorganic layer including an inorganic material. When an impact is applied to an edge of the display device DD from the outside, the second dam part DMP2 may absorb the impact while being broken. Accordingly, the second dam part DMP2 can prevent external impact from being transferred to the display region DD_DA.

The display panel DP may include a substrate SUB, a pixel circuit layer PCL, a display element layer DPL, and the thin film encapsulation layer TFE. The display panel DP may have the same configuration as the display panel DP described with reference to FIGS. 3 to 4B.

As shown in FIGS. 15 and 16, a drive unit, e.g., the scan driver SDV, the emission driver EDV, and the data driver DVD, shown in FIG. 3, which is included in the pixel circuit layer PCL, may be disposed in the non-display region DD_NDA. The drive unit may include at least one driver transistor SDV_T formed through the same process as a second transistor T2 which is the transistor pixel (see PXL shown in FIG. 3). Each of the second transistor T2 and the driver transistor SDV_T may include a semiconductor layer SCL, a gate electrode GE, a source electrode SE, and a drain electrode DE.

Also, the drive unit may include signal lines SDV_SL disposed on the same layer as the source and drain electrodes SE and DE of the second transistor T2.

A power electrode PWE which provides a second pixel power source (see ELVSS shown in FIG. 4A) may be disposed at the outside of the drive unit, e.g., the scan driver SDV. The power electrode PWE may receive the second pixel power source ELVSS from the outside. A connection electrode E_CNT may be disposed on the passivation layer PSV. The connection electrode E_CNT may connect the power electrode PWE to a second electrode CE constituting a light emitting element OLED. Since the connection electrode E_CNT is formed through the same process as a first electrode AE constituting the light emitting element OLED, the connection electrode E_CNT may include the same layer structure and the same material as the first electrode AE. The connection electrode E_CNT may have the same thickness as the first electrode AE.

The thin film encapsulation layer TFE may include a first encapsulation layer ENC1 located throughout the display region DD_DA and the non-display region DD_NDA, a second encapsulation layer ENC2 which is located on the first encapsulation layer ENC1 and is is located throughout the display region DD_DA and at least a portion of the non-display region DD_NDA, and a third encapsulation layer ENC3 which is located on the second encapsulation layer ENC2 and is located throughout the display region DD_DA and at least a portion of the non-display region DD_NDA. In some embodiments, the third encapsulation layer ENC3 may be located throughout the whole of the display region DD_DA and the non-display region DD_NDA.

The first and third encapsulation layers ENC1 and ENC2 may be configured as an inorganic layer including an inorganic material, and the second encapsulation layer ENC2 may be configured as an organic layer including an organic material.

The pixel circuit layer PCL may include a line unit, a bent part insulating layer INS_B, and a bridge pattern BRP, which are located in the non-display region DD_NDA.

The line unit may include at least one data line DL, and be a fan-out line which connects the drive unit to the pixels PXL. In an example, the data line DL may extend up to a region in which the pad unit PDA is located at a boundary spot of the display region DD_DA and the non-display region DD_NDA.

The data line DL may include a plurality of sub-lines. In an example, the data line DL may include a first sub-line DLa located in the display region DD_DA, a second sub-line DLb located in the first flat region FA1 in the non-display region DD_NDA, a third sub-line DLc located in the bent region BA in the non-display region DD_NDA, and a fourth sub-line DLd located in the second flat region FA2 in the non-display region DD_NDA. The first to fourth sub-lines DLa to DLd may be electrically and/or physically connected to each other. In an example, the first sub-line DLa may be connected to the second sub-line DLb, the second sub-line DLb may be connected to the third sub-line DLc, the third sub-line DLc may be connected is to the fourth sub-line DLd, and the fourth sub-line DLd may be connected to one display panel pad DP_PD included in the pad unit PDA through the bridge pattern BRP.

The first sub-line DLa may have the same configuration as the jth data line DLj connected to one pixel PXL described with reference to FIG. 4A. The first sub-line DLa may be integrally or non-integrally formed with the source electrode SE of the second transistor T2 to be connected to the source electrode SE.

The bent part insulating layer INS_B may be provided in an opening located in the bent region BA. The opening may be formed through a process of removing a portion of an insulating layer located in the bent region BA. For example, the opening may be formed when the buffer layer BFL, the gate insulating layer GI, and the interlayer insulating layer ILD are removed in the bent region BA. However, the insulating layers removed to form the opening are not limited to the above-described example.

The bent part insulating layer INS_B may fill the opening. The bent part insulating layer INS_B may be an organic insulating layer including an organic material. The organic material may include, for example, an organic insulating material such as a polyacryl-based compound, a polyimide-based compound, a fluorine-based compound such as Teflon, or a benzocyclobutene-based compound. The third sub-line DLc may be located on the bent part insulating layer iNS_B.

The touch sensor TS may include a base layer BSL, sensor electrodes, and sensing lines SL. The touch sensor TS may have the same configuration as the touch sensor TS described with reference to FIGS. 6 to 12E.

The sensor electrodes may include a plurality of first bridge patterns BRP1 included in a first conductive pattern CP1 also shown in FIG. 5, and a plurality of sensor patterns SP and a plurality of second bridge patterns BRP2 which are included in a second conductive pattern CP2 also shown in FIG. 5. The sensor patterns SP may include a plurality of first sensor patterns SP1 and a plurality of second sensor patterns SP2, which are electrically insulated from each other.

The sensing lines SL may include a plurality of first sensing lines SL1 and a plurality of sensing lines SL2, which are included in the second conductive pattern CP2.

In an embodiment, a first insulating pattern INSP1 may be provided and/or formed on each of the first and second sensor patterns SP1 and SP2, and a second insulating pattern INSP2 may be provided and/or formed on each of the sensing lines SL. The first insulating pattern INSP1 and the second insulating pattern INSP2 may be configured substantially the same as the first insulating pattern INSP1 and the second insulating pattern INSP2 described with reference to FIGS. 6 to 11B. The first insulating pattern INSP1 and the second insulating pattern INSP2 may include the same material, and be disposed in the same layer. In an example, the first insulating pattern INSP1 and the second insulating pattern INSP2 may be an inorganic insulating layer including an inorganic material or an organic insulating layer including an organic material.

The first insulating patterns INSP1 may be formed through the same process as each of the first sensor patterns SP1, the second sensor patterns SP2, and the second bridge patterns BRP2, which are disposed therebelow. The second insulating pattern INSP2 may be formed through the same process as each of the sensing lines SL disposed therebelow. The first insulating pattern INSP1 may be provided over components disposed therebelow to protect the components from a foreign substance, etc. from the outside. In addition, the second insulating pattern INSP2 may be provided over components disposed therebelow to protect the components from a foreign substance, etc. from the outside.

The pad unit PDA may include at least one display panel pad DP_PD and at least one touch sensor pad TS_PD, which may be included in the second conductive pattern CP2. The display panel pad DP_PD and the touch sensor pad TS_PD do not require a separate protection means such as the first and second insulating patterns INSP1 and INSP2 so as to be in contact with an external IC. That is, an insulating pattern is not provided on each of the display panel pad DP_PD and the touch sensor pad TS_PD, which are included in the pad unit PDA.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A touch sensor for a display device, the touch sensor comprising:
   a base layer;
   a first conductive layer disposed in a sensing region on the base layer;
   an insulating layer disposed on the first conductive layer;
   a second conductive layer disposed on the insulating layer in the sensing region;
   a first insulating pattern disposed on the second conductive layer;
   a plurality of signal lines provided in a non-sensing region, the plurality of signal lines being electrically connected to the first and second conductive layers; and
   a second insulating pattern disposed on the plurality of signal lines,
   wherein the first insulating pattern and the second insulating pattern comprise the same material and are provided in the same layer,
   wherein the first insulating pattern and the second conductive layer are simultaneously etched to have substantially the same planar shape.

2. The touch sensor of claim 1, wherein the first insulating pattern overlaps the second conductive layer, and the second insulating pattern overlaps the signal lines.

3. The touch sensor of claim 1, wherein the second insulating pattern is formed in the same etching process as the signal lines to have substantially the same planar shape as the signal lines.

4. The touch sensor of claim 2, wherein the first insulating pattern is in contact with at least a portion of the second conductive layer.

5. The touch sensor of claim 4, wherein the first insulating pattern and the second insulating pattern include at least one of an inorganic insulating material and an organic insulating material.

6. The touch sensor of claim 5, wherein the second conductive layer comprises a second conductive pattern including:
   a plurality of first sensor patterns disposed on the insulating layer, the plurality of first sensor patterns being arranged in a first direction;
   a plurality of second sensor patterns disposed on the insulating layer, the plurality of second sensor patterns being arranged in a second direction intersecting the first direction, the plurality of second sensor patterns being spaced apart from the first sensor patterns; and
   a plurality of second bridge patterns connecting the second sensor patterns to each other,
   wherein the first conductive layer comprises a first conductive pattern including a plurality of first bridge patterns disposed between the base layer and the insulating layer in the sensing region, the plurality of first bridge patterns connecting the first sensor patterns to each other.

7. The touch sensor of claim 6, wherein the first insulating pattern is disposed on each of the first sensor patterns, the second sensor patterns, and the second bridge patterns.

8. The touch sensor of claim 7, wherein the first insulating pattern is formed in the same process as each of the first sensor patterns, the second sensor patterns, and the second bridge patterns.

9. The touch sensor of claim 8, wherein the first insulating pattern is in contact with at least a portion of each of the first sensor patterns, at least a portion of each of the second sensor patterns, and at least a portion of each of the second bridge patterns.

10. The touch sensor of claim 9, wherein the first insulating pattern is in contact with an upper surface of the first sensor pattern, an upper surface of the second sensor pattern, and an upper surface of the second bridge pattern.

11. The touch sensor of claim 5, wherein the second insulating pattern is in contact with at least a portion of each of the signal lines.

12. The touch sensor of claim 11, wherein the signal lines comprises sensing lines and at least some of the sensing lines include:
    a first metal layer disposed between the base layer and the insulating layer; and
    a second metal layer disposed between the insulating layer and the second insulating pattern, the second metal layer overlapping the first metal layer,
    wherein the second insulating pattern and the second metal layer are provided through the same process.

13. A method of fabricating a touch sensor for a display device, the method comprising the steps of:
    providing a base layer for a sensing region and a non-sensing region surrounding at least one side of the sensing region;
    forming, on the base layer, a first conductive layer in the sensing region and at least one first metal layer in the non-sensing region;
    forming an insulating layer on the first conductive layer and the first metal layer, the insulating layer including contact holes exposing at least a portion of the first conductive layer;
    sequentially forming a metal material layer and an insulating material layer on the insulating layer; and
    forming a second conductive layer having a first insulating pattern disposed on the top thereof and a second metal layer having a second insulating pattern disposed on the top thereof by simultaneously etching the metal material layer and the insulating material layer,
    wherein the second conductive layer and the first insulating pattern correspond to the sensing region on the insulating layer, and the second metal layer and the second insulating pattern correspond to the non-sensing region on the insulating layer,
    wherein the first insulating pattern and the second insulating pattern include at least one of an inorganic insulating material and an organic insulating material.

14. The method of claim 13, wherein the second conductive layer includes:
    a plurality of first sensor patterns disposed on the insulating layer, the plurality of first sensor patterns being arranged in a first direction;

a plurality of second sensor patterns disposed on the insulating layer, the plurality of second sensor patterns being arranged in a second direction intersecting the first direction, the plurality of second sensor patterns being spaced apart from the first sensor patterns; and a plurality of second bridge patterns connecting the second sensor patterns to each other, wherein the first conductive layer includes a plurality of first bridge patterns disposed between the base layer and the insulating layer in the sensing region, the plurality of first bridge patterns connecting the first sensor patterns to each other.

15. The method of claim 14, wherein the first insulating pattern is disposed on each of the first sensor patterns, the second sensor patterns, and the second bridge patterns.

16. The method of claim 15, wherein the first insulating pattern is in contact with an upper surface of the first sensor pattern, an upper surface of the second sensor pattern, and an upper surface of the second bridge pattern.

17. A display device comprising:
a display panel to display an image; and
a touch sensor disposed on the display panel,
wherein the touch sensor comprises:
a base layer disposed on the display panel;
a first conductive layer disposed in a sensing region on the base layer;
an insulating layer disposed on the first conductive layer;
a second conductive layer disposed on the insulating layer in the sensing region;
a first insulating pattern disposed on the second conductive layer;
a plurality of signal lines provided in a non-sensing region on the base layer, the plurality of signal lines being electrically connected to the first and second conductive layers; and
a second insulating pattern disposed on the plurality of signal lines, wherein the first insulating pattern and the second insulating pattern include the same material and are provided in the same layer, wherein the first insulating pattern and the second conductive layer are simultaneously etched to have substantially the same planar shape.

18. The display device of claim 17, wherein the first insulating pattern and the second insulating pattern include at least one of an inorganic insulating material and an organic insulating material.

19. The display device of claim 18, wherein the first insulating pattern overlaps the second conductive layer, and the second insulating pattern overlaps the signal lines, wherein the second insulating pattern is formed in the same etching process as the signal lines to have substantially the same planar shape as the signal lines.

20. The display device of claim 19, wherein the second conductive layer comprises a second conductive pattern including:

a plurality of first sensor patterns disposed on the insulating layer, the plurality of first sensor patterns being arranged in a first direction;

a plurality of second sensor patterns disposed on the insulating layer, the plurality of second sensor patterns being arranged in a second direction intersecting the first direction, the plurality of second sensor patterns being spaced apart from the first sensor patterns; and a plurality of second bridge patterns connecting the second sensor patterns to each other, wherein the first conductive layer comprises a second conductive pattern including a plurality of first bridge patterns disposed between the base layer and the insulating layer in the sensing region, the plurality of first bridge patterns connecting the first sensor patterns to each other.

* * * * *